US012648330B2

(12) United States Patent
Lee et al.

(10) Patent No.: US 12,648,330 B2
(45) Date of Patent: *Jun. 2, 2026

(54) DISPLAY PANEL WITH IMPROVED LUMINANCE OR EFFICIENCY AND DISPLAY DEVICE COMPRISING THE SAME

(71) Applicant: LG Display Co., Ltd., Seoul (KR)

(72) Inventors: Sunmi Lee, Gyeonggi-do (KR);
JungSun Baek, Gyeonggi-do (KR);
NamYong Kim, Gyeonggi-do (KR);
GoEun Lim, Gyeonggi-do (KR);
Seongjoo Lee, Gyeonggi-do (KR);
Seungpyo Hong, Gyeonggi-do (KR);
Hyojae Lee, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 29 days.

This patent is subject to a terminal disclaimer.

(21) Appl. No.: 18/762,511

(22) Filed: Jul. 2, 2024

(65) Prior Publication Data

US 2024/0357896 A1      Oct. 24, 2024

Related U.S. Application Data

(63) Continuation of application No. 18/210,426, filed on Jun. 15, 2023, now Pat. No. 12,063,834, which is a
(Continued)

(30) Foreign Application Priority Data

Nov. 6, 2019      (KR) ........................ 10-2019-0141087
Sep. 28, 2020      (KR) ........................ 10-2020-0125663

(51) Int. Cl.
*H10K 59/50*      (2023.01)
*H10K 59/122*      (2023.01)
(Continued)

(52) U.S. Cl.
CPC .......... *H10K 59/50* (2023.02); *H10K 59/122* (2023.02); *H10K 59/352* (2023.02); *H10K 59/40* (2023.02);
(Continued)

(58) Field of Classification Search
CPC ..... H10K 59/352; H10K 59/40; H10K 59/122
(Continued)

(56) References Cited

U.S. PATENT DOCUMENTS 9,478,742 B2      10/2016   Takagi et al.
2015/0060820 A1*   3/2015   Takagi ............. H10K 59/80515
                                                     438/46
(Continued)

FOREIGN PATENT DOCUMENTS

CN          104425766 A      3/2015
KR    10-2015-0026883 A      3/2015
KR    10-2018-0014384 A      2/2018

*Primary Examiner* — Xia L Cross
(74) *Attorney, Agent, or Firm* — Morgan, Lewis & Bockius LLP

(57) ABSTRACT

The present disclosure relates to display panels and display devices including the display panels, and for example, to a display panel with excellent luminance and a display device including the display panel. In one aspect, the display panel may include an insulating film having an inclined portion with a high-inclined portion. In another aspect, the display panel may include a plurality of touch electrodes on the encapsulation layer having an open area. In a plan view, at least two of the open areas respectively include at least two light emitting areas, and a size of the at least two light emitting areas of a first sub-pixel is different from a size of the at least two light emitting areas of a second sub-pixel.

20 Claims, 17 Drawing Sheets

Related U.S. Application Data continuation of application No. 17/091,327, filed on Nov. 6, 2020, now Pat. No. 11,723,251.

(51) Int. Cl.
    *H10K 59/35* (2023.01)
    *H10K 59/40* (2023.01)
    *H10K 59/80* (2023.01)

(52) U.S. Cl.
    CPC ....... *H10K 59/8731* (2023.02); *H10K 59/878* (2023.02); *H10K 59/80518* (2023.02)

(58) Field of Classification Search
    USPC .......................................................... 257/40
    See application file for complete search history.

(56) References Cited

U.S. PATENT DOCUMENTS

| | | |
|---|---|---|
| 2018/0033831 A1 | 2/2018 | An et al. |
| 2018/0034000 A1* | 2/2018 | Lee ..................... H10K 59/122 |
| 2018/0095566 A1* | 4/2018 | Lee ........................ H10K 59/40 |
| 2018/0331316 A1 | 11/2018 | Lee et al. |
| 2018/0331325 A1 | 11/2018 | Zhang |
| 2019/0204952 A1 | 7/2019 | Han et al. |
| 2020/0133040 A1* | 4/2020 | Bang ..................... G02F 1/1333 |

* cited by examiner

TSP    A/A

N/A

320

TLd (Driving TL)

TLs (Sensing TE)

TLd (Driving TL)

TLs (Sensing TL)

DISPLAY PANEL WITH IMPROVED LUMINANCE OR EFFICIENCY AND DISPLAY DEVICE COMPRISING THE SAME

CROSS-REFERENCE TO RELATED APPLICATIONS

This is a continuation of U.S. application Ser. No. 18/210,426, filed Jun. 15, 2023, which is a continuation of U.S. application Ser. No. 17/091,327, filed Nov. 6, 2020, which claims the priority benefit of Korean Patent Application No. 10-2019-0141087, filed on Nov. 6, 2019, in the Korean Intellectual Property Office, and Korean Patent Application No. 10-2020-0125663, filed on Sep. 28, 2020, in the Korean Intellectual Property Office, all which are incorporated herein by reference.

BACKGROUND

1. Technical Field

The present disclosure relates to a display panel and a display device including the display panel.

2. Description of the Related Art

As information society advances, there has been a growing need for display devices that display images. In recent years, a range of display devices, such as a liquid crystal display (LCD) device, a plasma display panel (PDP) device, an organic light emitting display (OLED) device, and the like, have been utilized.

These display devices are typically configured to allow light to be discharged from the display device to display images. However, there may be difficulties in improving luminance or efficiency of the display device due to problems, such as a situation where light has not fully exited from the display device and is trapped inside, and the like.

SUMMARY

Accordingly, the present disclosure is directed to a display panel and a display device including the display panel that substantially obviate one or more problems due to limitations and disadvantages of the related art.

In accordance with embodiments of the present disclosure, a display panel with improved luminance or efficiency can be provided. Furthermore, in accordance with embodiments of the present disclosure, a display device with improved luminance or efficiency can be provided.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In accordance with an aspect of the present disclosure, a display panel including a plurality of sub-pixels includes a substrate; an insulating film on the substrate and including a concave portion having a flat portion and an inclined portion surrounding the flat portion in one or more of the plurality of sub-pixels; a first electrode on the insulating film, on an upper portion of the concave portion, and on a periphery portion extending from the concave portion, in the one or more sub-pixels; a bank on the first electrode and the insulating film, and having an opening corresponding to a part of the flat portion in the one or more sub-pixels; a light emitting layer on the first electrode and in the opening of the bank in the one or more sub-pixels; and a second electrode on the light emitting layer and the bank.

In accordance with another aspect of the present disclosure, a display device including a plurality of sub-pixels includes a substrate; an insulating film on the substrate and including a concave portion having a flat portion and an inclined portion surrounding the flat portion in one or more of the plurality of sub-pixels, the inclined portion including a high-inclined portion having a second inclined angle larger than a first inclined angle between a portion of the inclined portion contacting the flat portion and a surface of the substrate; a first electrode on the insulating film, on an upper portion of the concave portion, and on a periphery portion extending from the concave portion, in the one or more sub-pixels; a bank on the first electrode and the insulating film, and having an opening corresponding to a part of the flat portion in the one or more sub-pixels; a light emitting layer on the first electrode and in the opening of the bank in the one or more sub-pixels; and a second electrode on the light emitting layer and the bank; and a driving circuit for driving the display panel.

The display panel of the display device may be the display panel according to the embodiments of the present disclosure described above.

In accordance with embodiments of the present disclosure, it may be possible to provide a display panel with improved luminance or efficiency and a display device including the display panel.

Further, in accordance with embodiments of the present disclosure, because some of the light emitted from a light emitting layer can be reflected by an insulating film including an inclined portion, it may be possible to provide a display panel with improved luminance or efficiency and a display device including the display panel.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings:

FIG. 16 illustrates the active area and the non-active area extending from the active area according to embodiments of the present disclosure.

DETAILED DESCRIPTION

Figure 1:
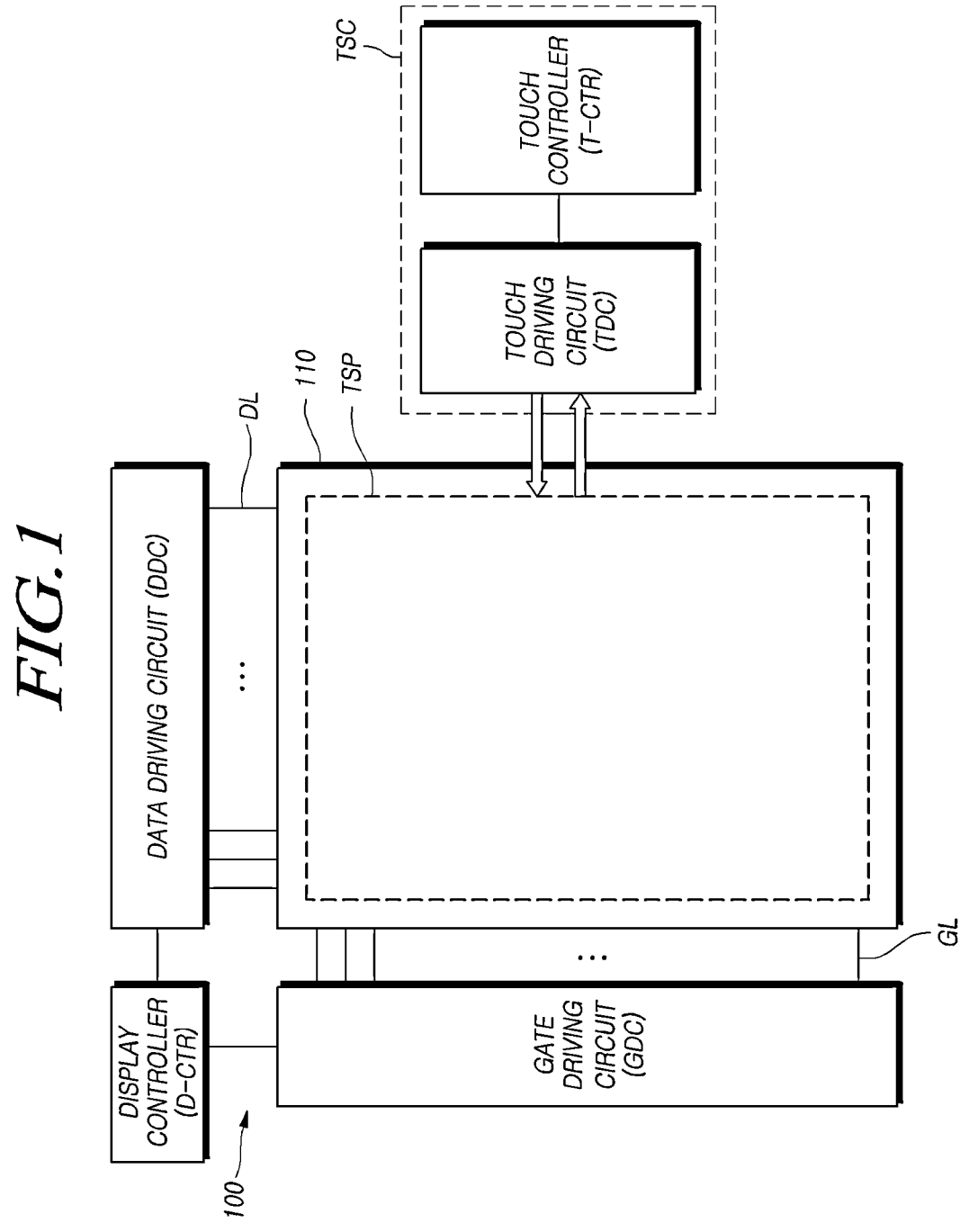
FIG. 1 illustrates a system configuration of a display device according to embodiments of the present disclosure.

Reference will now be made in detail to the example embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

In the following description of the disclosure, detailed description of known functions and configurations incorporated herein may be omitted when it may make the subject matter of the disclosure rather unclear. The terms such as "including", "having", "containing", "comprising of", and "consist of" used herein are generally intended to allow other components to be added unless the terms are used with the term "only". As used herein, singular forms are intended to include plural forms unless the context clearly indicates otherwise.

Terms, such as first, second, A, B, (A), or (B) may be used herein to describe elements of the disclosure. Each of the terms is not used to define essence, order, sequence, or number of an element, but is used merely to distinguish the corresponding element from another element.

Herein, situations in which two or more elements included in embodiments of the present disclosure are connected, combined, coupled, contacted, or the like may include not only directly or physically connecting, combining, coupling, or contacting between two or more elements, but interposing of another element between the two or more elements. Here, the another element may be included in one or more of the two or more elements connected, combined, coupled, or contacted (to) one another.

In describing time relative terms with reference to elements, operations, steps, or processes included in embodiments of the present disclosure, situations in which "after", "subsequent to", "next to", "before", or the like is used to describe a temporal sequential relationship or a flow sequential relationship between events, operations, or the like are generally intended to include events, situations, cases, operations, or the like that do not occur consecutively unless the terms, such as "directly", "immediately", or the like, are used.

Meanwhile, when numerical values for elements included in embodiments of the present disclosure or their associated information (e.g., levels etc.) are described, even when specific relevant descriptions are not given, the numerical values or the associated information may be interpreted as including a margin of error that can be caused by several factors (e.g., factors in the process, internal or external impact, noise, etc.).

FIG. 1 illustrates a system configuration of a display device according to embodiments of the present disclosure.

With reference to FIG. 1, the display device according to embodiments of the present disclosure may have a function of displaying images and a function of sensing a touch of a user.

For displaying images, the display device according to embodiments of the present disclosure may include a display panel 110 on which a plurality of data lines and a plurality of gate lines are arranged, and a display driving circuit for driving the display panel 110.

The display driving circuit may include a data driving circuit DDC for driving a plurality of data lines, a gate driving circuit GDC for driving a plurality of gate lines, and a display controller D-CTR for controlling the data driving circuit DDC and the gate driving circuit GDC.

The display device according to embodiments of the present disclosure may include a touch panel TSP on which a plurality of touch electrodes as touch sensors is disposed, and a touch sensing circuit TSC for processing the driving and sensing of the touch panel TSP.

The touch sensing circuit TSC supplies a driving signal to the touch panel TSP to drive the touch panel TSP, detects a sensing signal from the touch panel TSP, and based on this, senses the presence or absence of a touch and/or a touch location (e.g., a touch coordinate).

Such a touch sensing circuit TSC may be implemented by including a touch driving circuit TDC supplying a driving signal and receiving a sensing signal, and a touch controller T-CTR determining the presence or absence of a touch and/or a touch location (e.g., a touch coordinate).

The touch sensing circuit TSC may be implemented as one or more components (e.g., an integrated circuit), or implemented separately from the display driving circuit. Further, all or at least one part of the touch sensing circuit TSC may be integrated with the display driving circuit or as one or more circuits or components included in the display driving circuit, and thus, in turn, implemented as the integrated configuration. For example, the touch driving circuit TDC of the touch sensing circuit TSC may be implemented as an integrated circuit by being integrated with the data driving circuit DDC of the display driving circuit.

Meanwhile, the display device according to embodiments of the present disclosure can sense a touch based on a capacitance between a plurality of touch electrodes TE (touch sensors) or between one or more touch electrodes and a touch object such as a finger, a pen, or the like.

The display device according to embodiments of the present disclosure may be implemented in a capacitance-based touch sensing scheme. For example, the display device may be implemented in either a mutual-capacitive touch sensing scheme or a self-capacitive touch sensing scheme.

Figure 2:
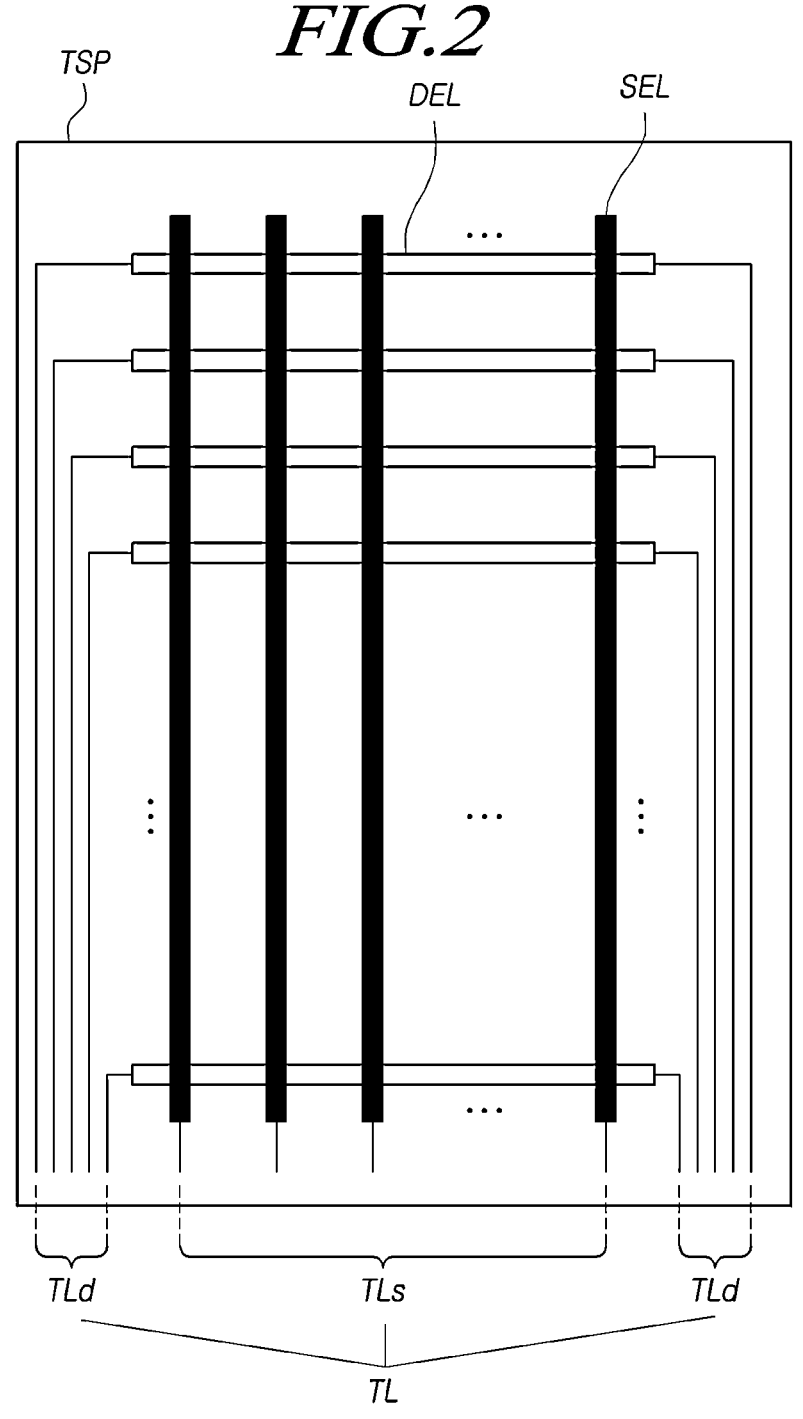
FIGS. 2 and 3 illustrate examples of a touch panel when the display device senses a touch in a mutual-capacitive touch sensing scheme according to embodiments of the present disclosure.
Figure 3:
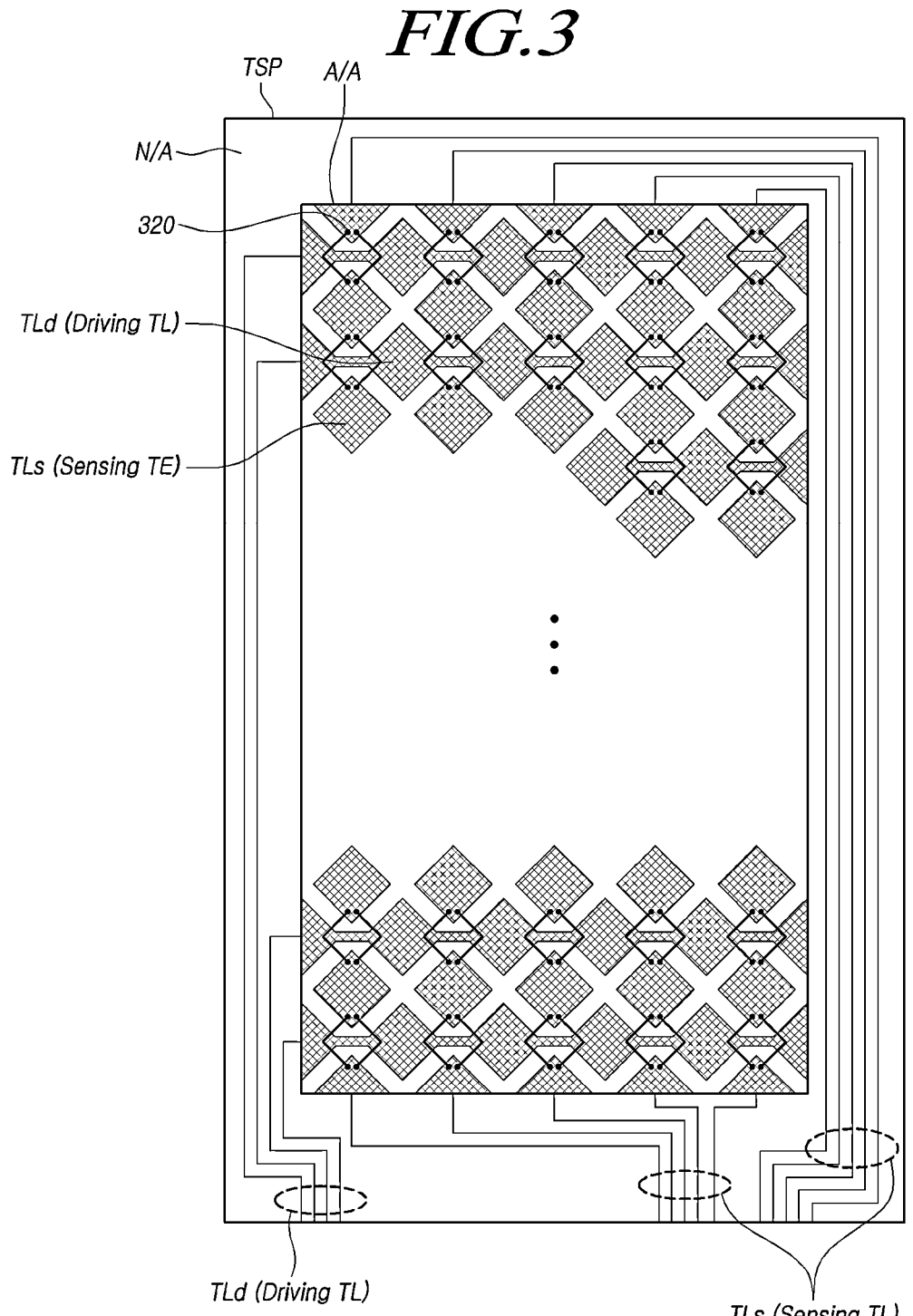
Figure 4:
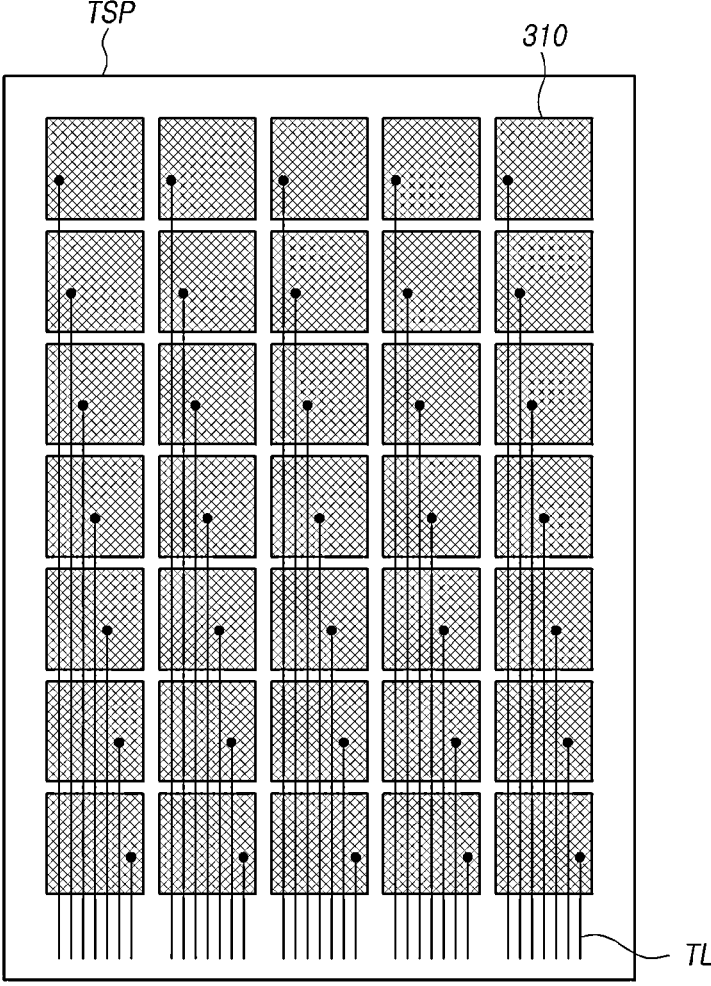
FIG. 4 illustrates an example of a touch panel when the display device senses a touch in a self-capacitive touch sensing scheme according to embodiments of the present disclosure.

FIGS. 2 to 4 illustrate examples of touch panels TSP included in the display device in accordance with embodiments of the present disclosure. FIGS. 2 and 3 illustrate examples of the touch panels TSP when the display device senses a touch in the mutual-capacitive touch sensing scheme according to embodiments of the present disclosure. FIG. 4 illustrates an example of the touch panel TSP when the display device senses a touch in the self-capacitive touch sensing scheme according to embodiments of the present disclosure.

With reference to FIG. 2, in the case of the mutual-capacitive touch sensing scheme, a plurality of touch electrodes disposed on the touch panel TSP may be classified into one or more driving touch electrodes (which may be referred to as driving electrodes, transmission electrodes, driving lines, etc.) to which one or more driving signals are applied, and one or more sensing touch electrodes (which may be referred to as sensing electrodes, reception electrodes, sensing lines, etc.) allowing a sensing signal to be sensed and forming a capacitance with the one or more driving touch electrodes.

Among the driving touch electrodes of the touch electrodes, two or more driving touch electrodes disposed in an identical row (or an identical column) may be electrically connected to one another by being integrated into one body (or being connected to one another with bridge connections such as patterned bridges), and in turn, form one driving touch electrode line DEL.

With reference to FIG. 2, among the sensing touch electrodes of the touch electrodes, one or more sensing touch electrodes disposed in an identical column (or an identical row) may be electrically connected to one another by being connected to one another with bridge connections such as patterned bridges, or being integrated into one body, and in turn, form one sensing touch electrode line SEL.

When the mutual-capacitive touch sensing scheme is used, the touch sensing circuit TSC supplies a driving signal to one or more driving touch electrode lines DEL, receives a sensing signal from one or more sensing touch electrode lines SEL, and based on the received sensing signal, detects the presence or absence of a touch and/or a touch coordinate according to changes in a capacitance (mutual-capacitance) between the driving touch electrode line DEL and the sensing touch electrode line SEL that depends on whether a point of a finger, a pen, or a conductive object is present.

With reference to FIG. 2, for providing a driving signal and a sensing signal, each of a plurality of driving touch electrode lines DEL and each of a plurality of sensing touch electrode lines SEL may be electrically connected to a touch driving circuit TDC via one or more touch lines TL.

For example, for providing a driving signal, each of the plurality of driving touch electrode lines DEL may be electrically connected to the touch driving circuit TDC via one or more driving touch lines TLd. Further, for providing a sensing signal, each of the plurality of sensing touch electrode lines SEL may be electrically connected to the touch driving circuit TDC via one or more sensing touch lines TLs.

Further, the display device 100 to which the mutual-capacitive touch sensing scheme is applied may be configured as illustrated in FIG. 3. With reference to FIG. 3, a plurality of touch electrodes 310 may be disposed in the touch panel TSP, and touch lines TL electrically connecting the plurality of touch electrodes 310 with a touch circuit 130 may be arranged in the touch panel TSP.

Further, for electrically connecting the touch lines TL with the touch driving circuit TDC, touch pads that the touch driving circuit TDC contacts may be located in the touch panel TSP.

The touch electrodes 310 and the touch lines TL may be located in a same layer or in different respective layers. Two or more touch electrodes 310 forming one driving touch electrode line may be referred to as a driving touch electrode. Two or more touch electrodes 310 forming one sensing touch electrode line may be referred to as a sensing touch electrode.

At least one touch line 220 may be connected to each driving touch electrode line, and at least one touch line TL may be connected to each sensing touch electrode line. The at least one touch line 220 connected to each driving touch electrode line may be referred to as a driving touch line. The at least one touch line TL connected to each sensing touch electrode line may be referred to as a sensing touch line. One touch pad TP may be connected to each touch line TL.

With reference to FIG. 3, a shape running along the edge of each of the plurality of touch electrodes 310 may be, for example, a rhombus shape, or in some embodiments, be a rectangle shape (which may include a square shape). However, embodiments of the present disclosure are not limited thereto. That is, the touch electrodes may have various shapes. Further, a bridge configuration for a connection between two touch electrodes 310 may include one patterned bridge 320 or two or more patterned bridges 320.

The touch panel TSP according to embodiments of the present disclosure may be located inside of a display panel with an active area A/A and a non-active area N/A (referred to as an embedded type). When the embedded type of touch panel TSP is used, the corresponding touch panel TSP and the corresponding display panel may be fabricated together through one panel fabricating process. Furthermore, when the embedded type of touch panel TSP is used, the corresponding touch panel TSP may be a set of touch electrodes 310. Here, a plate on which the plurality of touch electrodes 310 is located may be a dedicated substrate, or a layer that is already present for another function (e.g., an encapsulation layer).

With reference to FIG. 4, when the self-capacitive touch sensing scheme is used, each touch electrode 310 disposed in the touch panel TSP may have both a function of a driving touch electrode to which a driving signal is applied, and a function of a sensing touch electrode from which a sensing signal is detected.

That is, a driving signal may be applied to each touch electrode 310, and a sensing signal may be received from the touch electrode 310 to which the driving signal is applied. Accordingly, when the self-capacitive touch sensing scheme is used, the driving electrode and the sensing electrode may have identical functions.

When the self-capacitive touch sensing scheme is used, the touch sensing circuit TSC supplies a driving signal to one or more touch electrodes 310, receives a sensing signal from the one or more touch electrodes 310, and based on the received sensing signal, detects the presence or absence of a touch and/or a touch coordinate according to changes in a capacitance between the touch electrode 310 and a point of a finger, a pen, or a conductive object.

With reference to FIG. 4, for providing a driving signal and a sensing signal, each of a plurality of touch electrodes 310 may be electrically connected to the touch driving circuit TDC via one or more touch lines TL. Thus, the display device in accordance with embodiments of the present disclosure may sense a touch based on the mutual-capacitive touch sensing scheme or the self-capacitive touch sensing scheme.

Meanwhile, in the display device in accordance with embodiments of the present disclosure, the touch panel TSP may be implemented in the embedded type in which the touch panel is fabricated together when the display panel 110 is fabricated, and is located inside of the display panel 110. That is, the display panel 110 in accordance with embodiments of the present disclosure may include the touch panel TSP embedded in the display panel 110.

Further, touch electrodes 320 and touch lines 230 in accordance with embodiments of the present disclosure may be electrodes and signal lines located inside of the display panel 110.

Additionally, the display panel 110 of the display device in accordance with embodiments of the present disclosure may be a self-emissive display panel, such as an OLED panel, a quantum dot panel, a micro LED panel, or the like.

Figure 5:
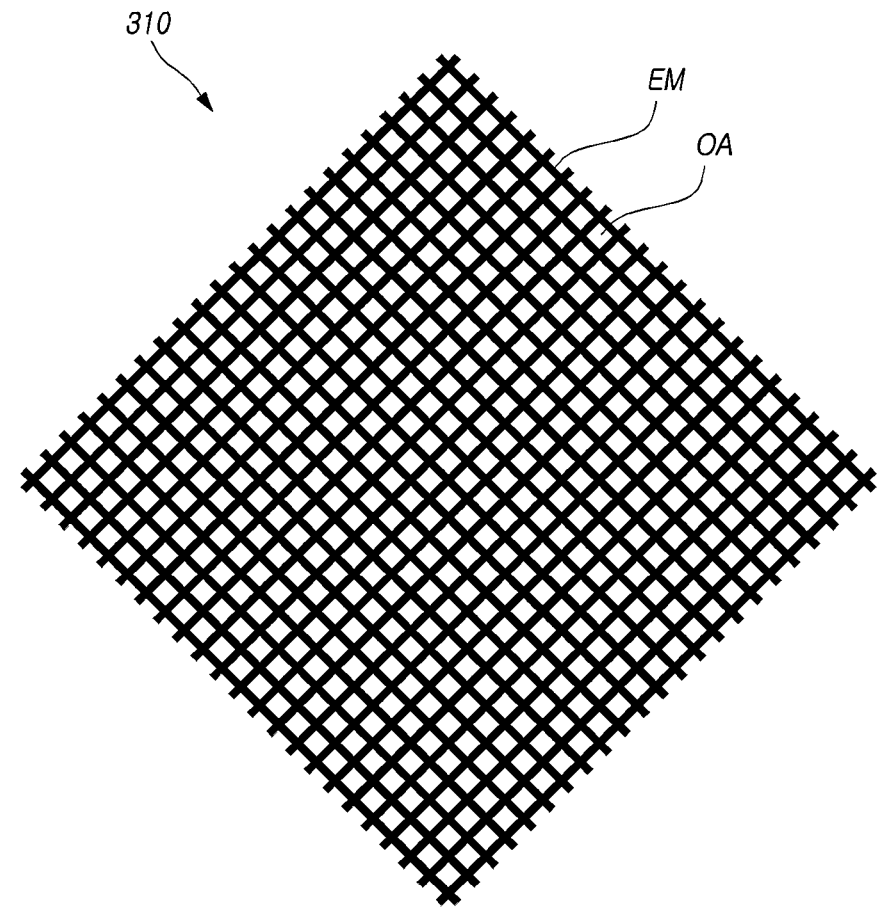
FIG. 5 illustrates that touch electrodes with a mesh pattern are disposed in the touch panel in a flexible display device according to embodiments of the present disclosure.

FIG. 5 illustrates touch electrodes with a mesh pattern that are disposed in a touch panel TSP in a flexible display device according to embodiments of the present disclosure.

With reference to FIG. 5, in the flexible display device in accordance with embodiments of the present disclosure, each of a plurality of touch electrode 310 disposed in the touch panel TSP may be a touch electrode of a mesh type. The touch electrode of the mesh type 310 may be a mesh-patterned electrode metal EM. A plurality of openings OA may be present in the touch electrode 310 of the mesh type.

Figure 6:
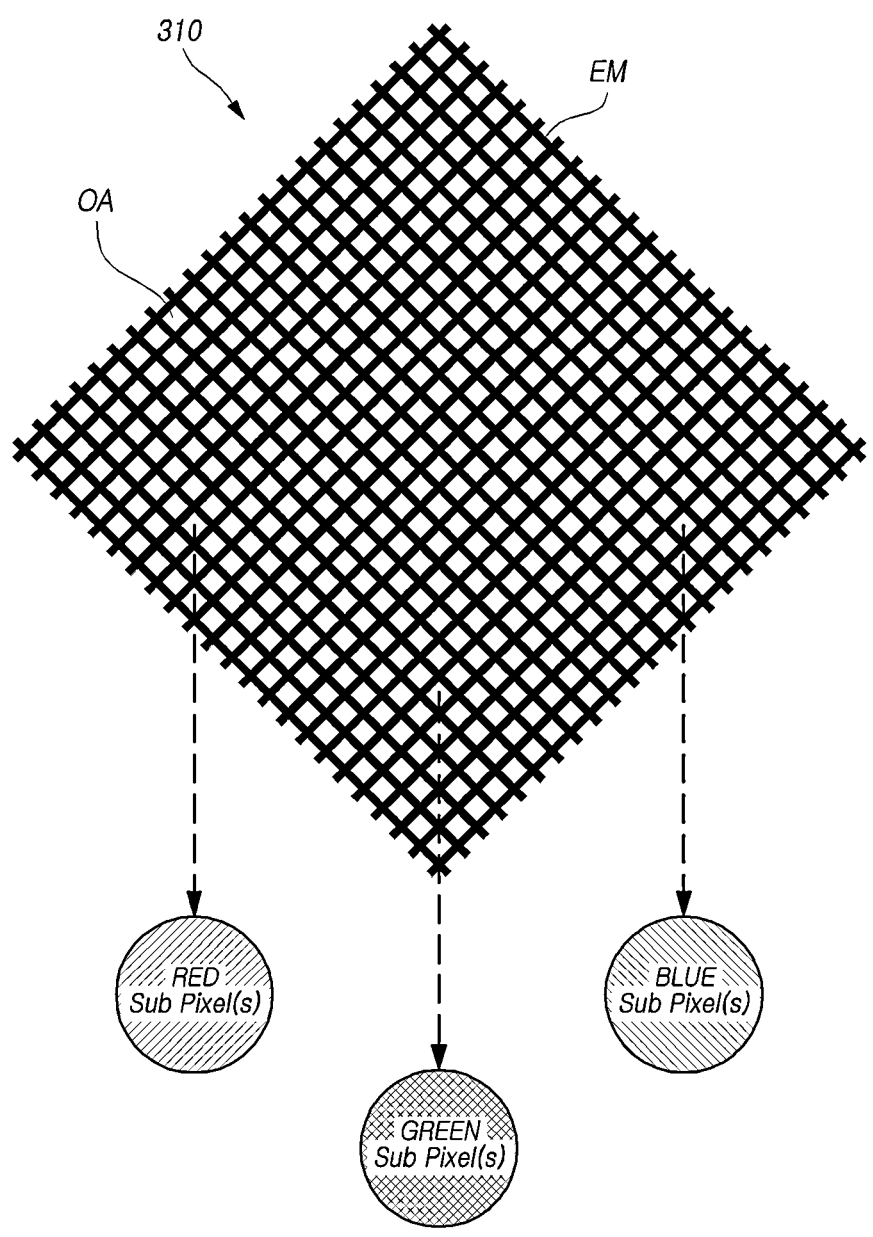
FIG. 6 illustrates a correspondence relationship between mesh-patterned touch electrodes and sub-pixels disposed in the touch panel in the flexible display device according to embodiments of the present disclosure.

FIG. 6 illustrates a correspondence relationship between touch electrodes of the mesh type and sub-pixels disposed in the touch panel TSP in the flexible display device according to embodiments of the present disclosure.

With reference to FIG. 6, each of the openings OA being present in the touch electrode 310 that is the mesh-patterned electrode metal EM may correspond to a light emitting area of one or more sub-pixels. For example, each of the plurality of openings OA present in one touch electrode 310 may correspond to a light emitting area of one or more of a red sub-pixel, a green sub-pixel, and a blue sub-pixel light.

For another example, each of the plurality of openings OA present in one touch electrode 310 may correspond to a light emitting area of one or more of a red sub-pixel, a green sub-pixel, a blue sub-pixel light, and a white sub-pixel.

As described above, when viewed in a plane, one or more light emitting area(s) of one or more sub-pixels being present in each of the openings OA of each touch electrode 310 may allow touch sensing to be performed and lead to touch panel 110 having a higher aperture ratio and greater luminescence efficiency.

As described above, a shape running along the edge of one touch electrode 310 may be a rhombus shape, rectangular shape (including a square shape), or the like, and an opening formed in one touch electrode 310 may also have a rhombus shape, rectangular shape (including a square shape), or the like. However, such shapes of the touch electrode 310 and the openings OA may be designed to be modified by taking into account a shape of a sub-pixel, an arranged structure of sub-pixels, touch sensitivity, or the like.

Hereinafter, a sub-pixel structure (a sub-pixel circuit) in a display panel for displaying images using an organic light emitting diode OLED will be described in detail with reference to accompanying drawings.

Figure 7:
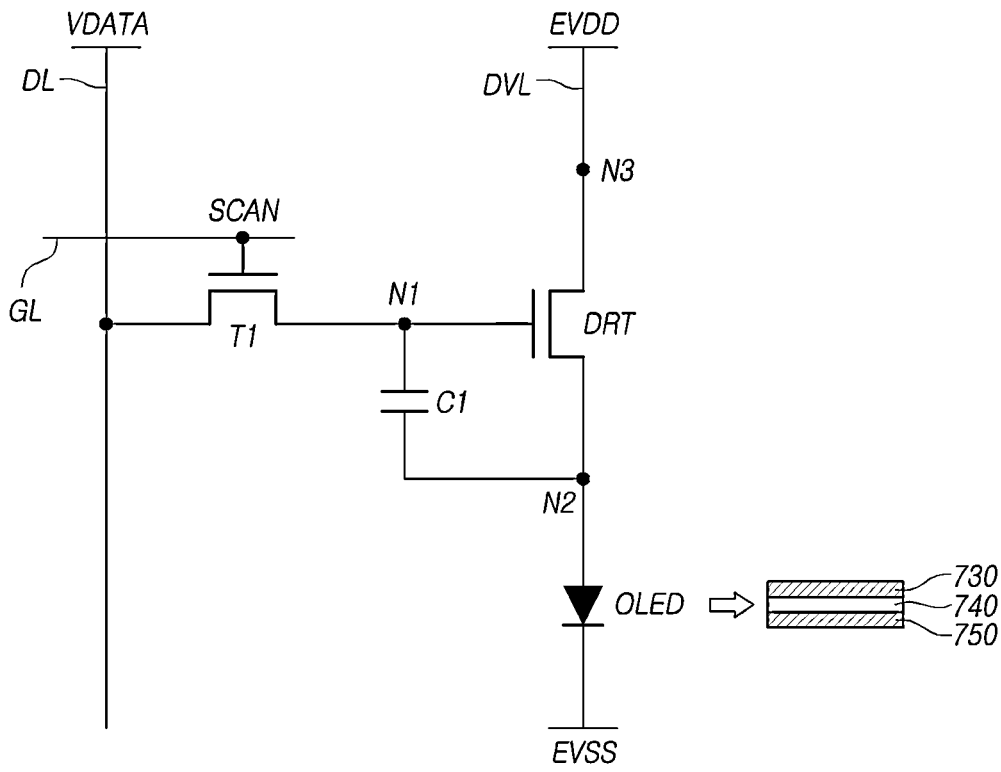
FIGS. 7 and 8 illustrate sub-pixel circuits of a display panel according to embodiments of the present disclosure.
Figure 8:
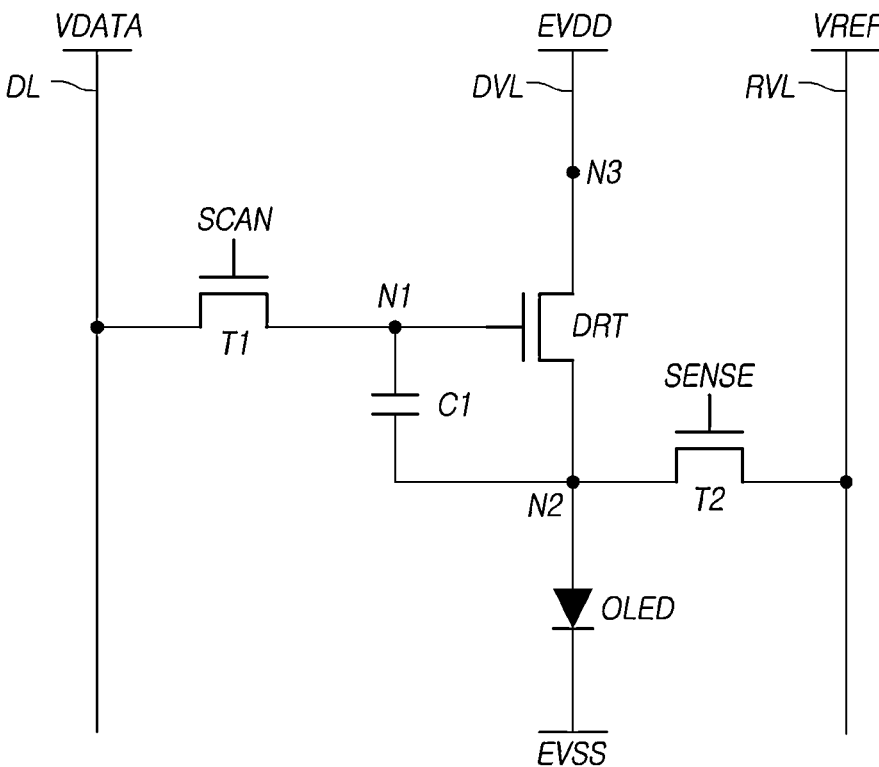

FIGS. 7 and 8 illustrate sub-pixel circuits of a display panel according to embodiments of the present disclosure.

With reference to FIGS. 7 and 8, each subpixel SP may include an organic light emitting diode OLED and a driving transistor DRT for driving the organic light emitting diode OLED.

Furthermore, with reference to FIG. 7, each sub-pixel SP may further include a first transistor T1 allowing a data voltage VDATA to be provided to a first node N1 corresponding to a gate node of the driving transistor DRT, and a storage capacitor C1 for storing a data voltage VDATA corresponding to an image signal voltage or a voltage corresponding to this during one frame time.

The organic light emitting diode OLED may include a first electrode 730 (an anode electrode or a cathode electrode), a light emitting layer 740, and a second electrode 750 (the cathode electrode or the anode electrode). For example, a low-level voltage EVSS may be applied to the second electrode 750 of the organic light emitting diode OLED.

The driving transistor DRT causes the organic light emitting diode OLED to be driven by providing a driving current to the organic light emitting diode OLED. The driving transistor DRT includes a first node N1, a second node N2, and a third node N3. The first node N1 of the driving transistor DRT may be a node corresponding to the gate node thereof, and may be electrically connected to a source node or a drain node of the first transistor T1. The second node N2 of the driving transistor DRT may be electrically connected to the first electrode 730 of the organic light emitting diode OLED and may be a source node or a drain node. The third node N3 of the driving transistor DRT may be the drain node or the source node as a node to which a driving voltage EVDD is applied, and may be electrically connected to a driving voltage line DVL used to supply the driving voltage EVDD.

The driving transistor DRT and the first transistor T1 may be n-type transistors or p-type transistors.

The first transistor T1 may be electrically connected between a data line DL and the first node N1 of the driving transistor DRT and may be controlled by a scan signal SCAN that is provided through a gate line and applied to the gate node of the first transistor T1. The first transistor T1 may be turned on by the scan signal SCAN and allow a data voltage VDATA provided through the data line DL to be applied to the first node N1 of the driving transistor DRT.

The storage capacitor C1 may be electrically connected between the first node N1 and the second node N2 of the driving transistor DRT. The storage capacitor C1 may be an external capacitor intentionally designed to be located outside of the driving transistor DRT, in contrast to internal storage, such as a parasitic capacitance (e.g., Cgs, Cgd) present between the first node N1 and the second node N2 of the driving transistor DRT.

With reference to FIG. 8, each sub-pixel SP disposed in the display panel in accordance with embodiments of the present disclosure may further include a second transistor T2 in addition to the organic light emitting diode OLED, the driving transistor DRT, the first transistor T1, and the storage capacitor C1.

The second transistor T2 may be electrically connected between the second node N2 of the driving transistor DRT and a reference voltage line RVL used to supply a reference voltage VREF, and may be controlled by a sensing signal SENSE applied to the gate node of the second transistor T2, which is a type of the scan signal.

The additional inclusion of the second transistor T2 leads a voltage of the second node N2 of the driving transistor DRT included in the sub-pixel SP to be controlled effectively. The second transistor T2 is turned on by the scan signal SENSE and allows a reference voltage VREF provided through the reference voltage line RVL to be applied to the second node N2 of the driving transistor DRT.

The sub-pixel structure illustrated in FIG. 8 may be advantageous in accurately initializing a voltage in the second node N2 of the driving transistor DRT and in sensing an intrinsic characteristic value (e.g., threshold voltage or mobility) of the driving transistor DRT and an intrinsic characteristic value (e.g., threshold voltage) of the organic light emitting diode OLED.

Meanwhile, the scan signal SCAN and the sensing signal SENSE may be separate gate signals. In this case, the scan signal SCAN and the sensing signal SENSE, respectively, may be applied to the gate node of the first transistor T1 and the gate node of the second transistor T2 through different respective gate lines.

In some instances, the scan signal SCAN and the sensing signal SENSE may be the same gate signal. In this case, the scan signal SCAN and the sensing signal SENSE may be commonly applied to the gate node of the first transistor T1 and the gate node of the second transistor T2 through the same gate line.

Figure 9:
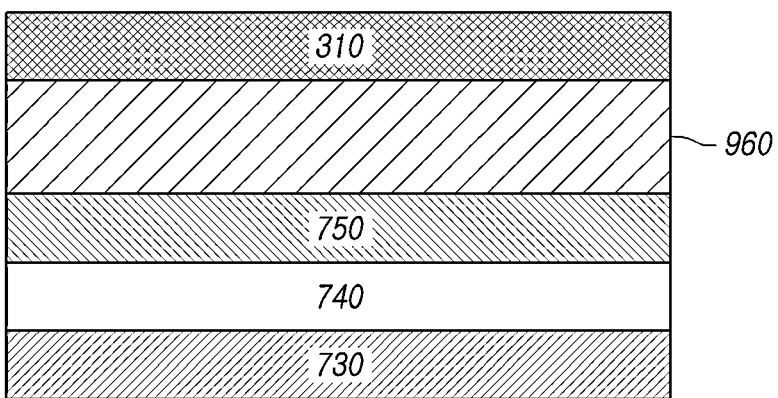
FIG. 9 illustrates a location of a touch electrode in the display panel according to embodiments of the present disclosure.

FIG. 9 illustrates a location of a touch electrode in the display panel according to embodiments of the present disclosure.

With reference to FIG. 9, a touch electrode 310 in the display panel in accordance with embodiments of the present disclosure may be disposed on an encapsulation layer 960 located on an organic light emitting diode OLED. Here, the encapsulation layer 960 is a layer for protecting an organic material included in a light emitting layer 740 from moisture, air, or the like, and may be located on a second electrode 750 of the organic light emitting diode OLED, which may be a cathode electrode. Such a structure, in which the touch electrode 310 is formed on the encapsulation layer 960, is sometimes referred to as a touch on encapsulation layer (TOE). Meanwhile, the encapsulation layer 960 may be formed of a metal or an inorganic material, or have a structure in which one or more organic insulating layer(s) and one or more inorganic insulating layer(s) are stacked.

Meanwhile, a color filter layer may be further present between the encapsulation layer 960 and the touch electrode 310, or on the touch electrode 310. In this configuration, a capacitance Cp may be formed due to a potential difference between the second electrode 750 and the touch electrode 310.

A capacitance needed for sensing a touch is a capacitance between the touch electrodes 310 or a capacitance between the touch electrode 310 and a touch object (e.g., a finger, a pen, or the like).

A planarization layer (not shown) may be located on the touch electrode 310. The planarization layer can planarize irregularities on the surface of the touch electrode 310. Furthermore, a touch substrate, such as a glass substrate, a plastic substrate, or the like, may be located on the planarization layer.

Meanwhile, luminance of the display panel 110 herein may vary depending on an amount of light exiting through the display panel 110 after being emitted from an organic light emitting element disposed in an active area A/A. As an amount of light exiting through the display panel 110 after being emitted from the organic light emitting element increases, the luminance of the display panel 110 may be improved.

Figure 10:
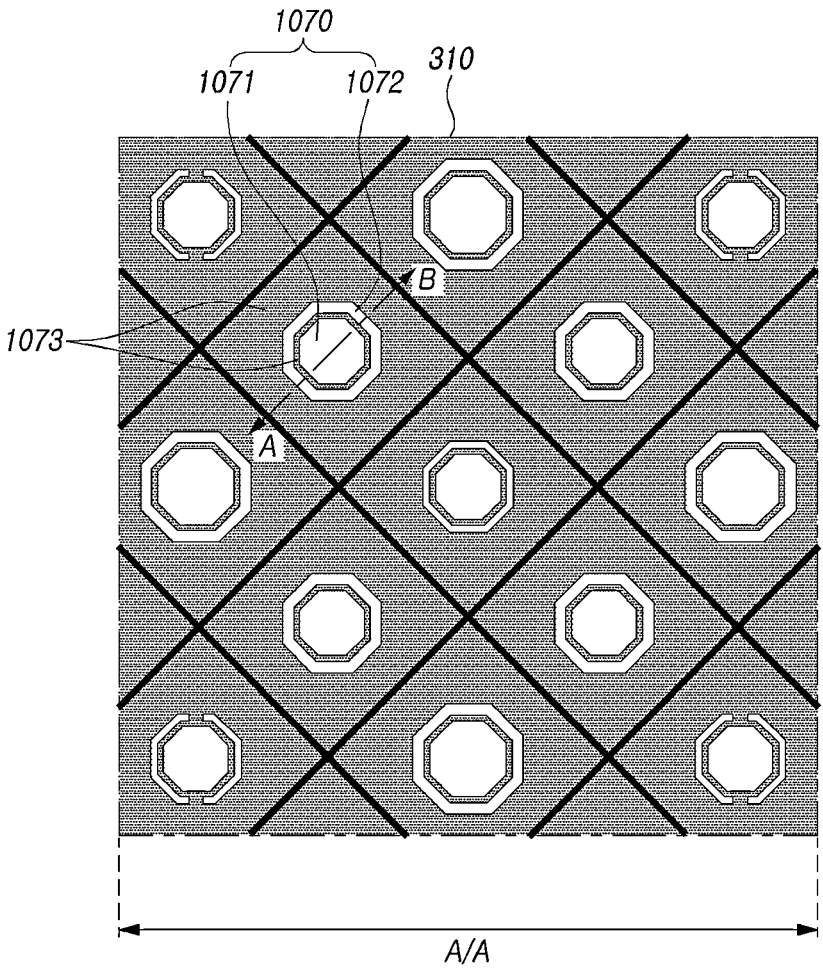
FIG. 10 is a plan view illustrating sub-pixels and light emitting areas included in an active area of the display panel according to embodiments of the present disclosure.

FIG. 10 is a plan view illustrating sub-pixels and light emitting areas included in an active area of the display panel according to embodiments of the present disclosure.

With reference to FIG. 10, the display device according to embodiments of the present disclosure includes a plurality of sub-pixels disposed in the active area A/A. Each of the sub-pixels may include at least one light emitting area 1070.

The light emitting area 1070 may include a first area 1071 and a second area 1072. The first area 1071 may be located in a center portion of the light emitting area 1070. The center portion of the light emitting area 1070 may refer to a partial area including a center area of the entire light emitting area 1070 included in one sub-pixel.

The second area 1072 may be located in a periphery portion of the light emitting area 1070. The periphery portion of the light emitting area 1070 may refer to a partial area including an outermost boundary of the light emitting area 1070 except for the center area of the entire light emitting area 1070 included in one sub-pixel.

The second area 1072 may surround the first area 1071 on a viewing surface. The viewing surface herein may be a surface located output of the display device in a direction which is parallel to a substrate of the display device and in which light generated in a light emitting layer is emitted.

The second area 1072 may have a plurality of island shapes spaced apart from one another in one sub-pixel. In this case, the second area 1072 may surround a periphery of the first area 1071, and have the plurality of island shapes separated from the first area 1071 by a non-light emitting area 1073.

The light emitting area 1070 includes the second area 1072, and the display panel 110 can therefore provide excellent luminance. An area of the first area 1071 may be larger than that of the second area 1072, and thus, the first area 1071 may be considered the main light emitting area of the light emitting area 1070.

Figure 11:
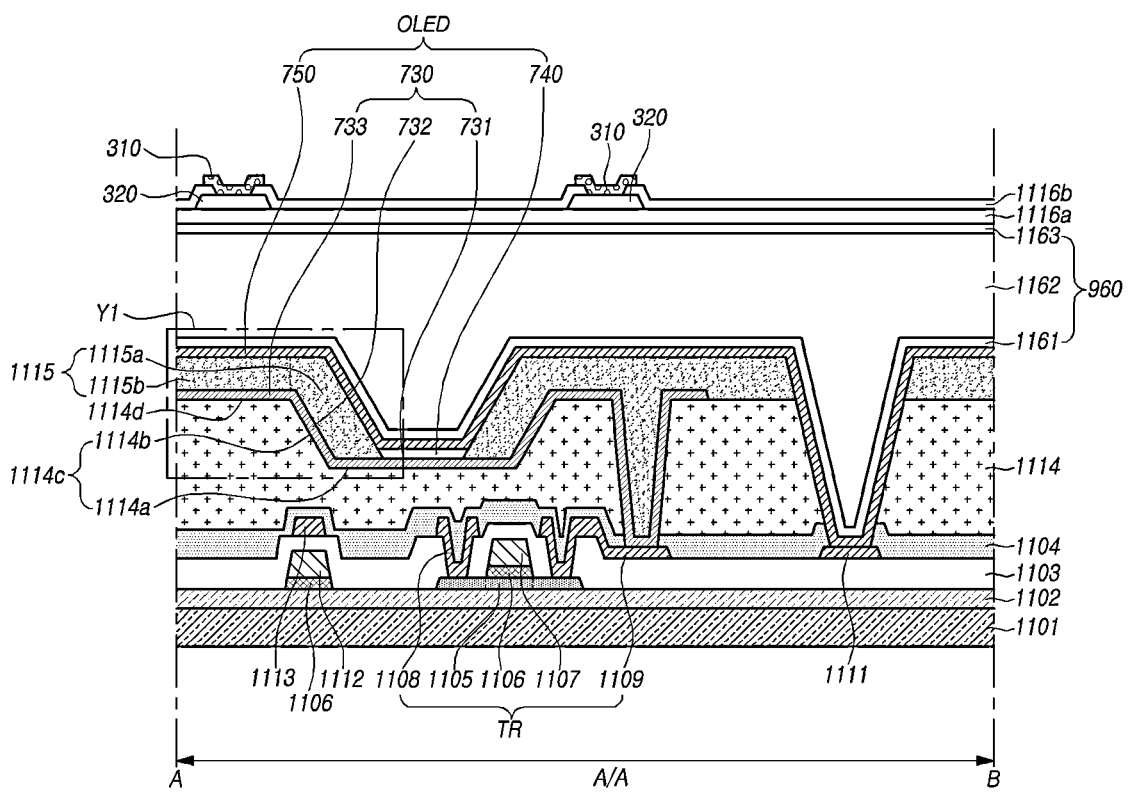
FIG. 11 to FIG. 13 are cross-sectional view illustrating an area taken along line A-B of the display device including the display panel according to embodiments of the present disclosure illustrated in FIG. 10 and a part of a non-active area.

FIG. 11 is a cross-sectional view illustrating an area taken along line A-B of the display device including the display panel according to embodiments of the present disclosure illustrated in FIG. 10 and a part of a non-active area according to embodiments of the present disclosure. FIG. 11 may represent an area corresponding to one sub-pixel SP in the display device according to embodiments of the present disclosure, or may represent a part of the non-active area.

With reference to FIG. 11, the display device according to embodiments of the present disclosure may include a substrate 1101, an insulating film 1114 located over the substrate, a first electrode 730 located on the insulating film 1114, a bank 1115 located on the first electrode 730 and the insulating film 1114, a light emitting layer 740 located on the first electrode 730, and a second electrode 750 located on the light emitting layer 740 and the bank 1115.

The display device may include a transistor TR located over the substrate 1101 and an organic light emitting diode OLED electrically connected to the transistor TR, in the active area (A/A, A-B cross-sectional area). The transistor TR may include an active layer 1105, a gate electrode 1107, a source electrode 1108, and a drain electrode 1109.

The organic light emitting diode OLED includes a first electrode 730, a light emitting layer 740, and a second electrode 750. Here, the first electrode 730 may be an anode electrode, and the second electrode 750 may be a cathode electrode; however, embodiments of the present disclosure are not limited thereto.

For example, a buffer layer 1102 may be disposed on the substrate 1101. The active layer 1105 of the transistor TR may be disposed on the buffer layer 1102. A gate insulating film 1106 may be disposed on the active layer 1105, and the gate electrode 1107 may be disposed on the gate insulating film 1106.

Meanwhile, although not shown in FIG. 11, the active layer 1105 according to embodiments of the present disclosure may include a channel area, and the channel area of the active layer 1105 may overlap with the gate insulating film 1106 and the gate electrode 1107. The gate insulating film 1106 and the gate electrode 1107 may be disposed in the channel area of the active layer 1105.

The interlayer insulating film 1103 may be disposed on the gate electrode 1107. The source electrode 1108 and the drain electrode 1109 may be disposed on the interlayer insulating film 1103. Furthermore, the source electrode 1108 and the drain electrode 1109 may be disposed to be spaced apart from each other on the interlayer insulating film 1103. Each of the source electrode 1108 and the drain electrode 1109 may contact the active layer 1105 through a hole formed in the interlayer insulating film 1103.

The transistor may be disposed over the substrate 1101 as described above; however, embodiments of the present disclosure are not limited thereto. For example, the gate electrode 1107 may be disposed on the substrate 1101; the active layer 1105 may be disposed over the gate electrode 1107; the source electrode 1108 may be disposed vertically to overlap with one end of the active layer 1105; and the drain electrode may be disposed vertically to overlap with the other end of the active layer 1105.

A protective film 1104 may be disposed to cover the transistor TR. An insulating film 1114 may be disposed on the protective film 1104. The insulating film 1114 may be formed of an organic material, but embodiments of the present disclosure are not limited thereto.

The insulating film 1114 may include at least one concave portion 1114c in one or more of a plurality of sub-pixels included in the display panel 110. In one or more of the plurality of sub-pixels, the insulating film 1114 may surround the concave portion 1114c, and include a periphery portion extending from the concave portion 1114c. The concave portion 1114c may incline a flat portion 1114a and an inclined portion 1114b surrounding the flat portion 1114a.

The surface of the flat portion 1114a of the concave portion 1114c may be a portion parallel to the surface of the substrate 1101, and the inclined portion 1114b may be a portion which surrounds the flat portion 1114a and in which the surface of the inclined portion 1114b has a certain angle to the surface of the substrate 1101. That is, the surface of the incline 1114b may not be parallel to the surface of the substrate 1101.

Further, the insulating film 1114 may have a contact hole spaced apart from the concave portion 1114c.

Further, the first electrode 730 may be disposed on the concave portion 1114c and the periphery portion 1114d of the insulating film 1114 in a sub-pixel in which the insulating film 1114 includes one or more concave portions 1114c.

Meanwhile, the first electrode 730 may include a first area 731 in which the top surface of the first electrode 730 is parallel to the surface of the substrate 1101, and a second area 732 which extends from the first area 731 and in which the top surface of the first electrode 730 has a certain angle to the surface of the substrate 1101. That is, the surface of the second area 732 may not be parallel to the surface of the substrate 1101. Further, the first electrode 730 may include a third area 733 which extends from the second area 732 and in which the top surface of the first electrode 730 is parallel to the surface of the substrate 1101. The third area 733 may be an area overlapping with the periphery portion 1114d of the insulating film 1114.

Further, as described above, in an area of at least one sub-pixel, the insulating film 1114 may include at least one contact hole spaced apart from the concave portion 1114c, and the transistor TR and the first electrode of the organic light emitting diode OLED may be electrically connected through the contact hole of the insulating film 1114. For example, the first electrode 730 may be electrically connected to the source electrode 1108 or the drain electrode 1109 of the transistor TR.

As illustrated in FIG. 11, the bank 1115 may be disposed on at least a part of the insulating film 1114 and at least a part of the first electrode 730. The bank 1115 may include a first part 1115a disposed on the first electrode 730 in an area corresponding to a part of the concave portion 1114c formed on the insulating film 1114, and a second part 1115b disposed on the first electrode 730 and the insulating film 1114 in an area corresponding to the periphery portion 1114d formed on the insulating film 1114.

The bank 1115 may have an opening that does not cover a part of the top surface of the first electrode 730 in an area overlapping with the concave portion 1114c. The opening may correspond to a part of the flat portion 1114a. The meaning that the opening corresponds to a part of the flat portion 1114a may indicate that the opening overlaps with a part of the flat portion 1114a in the sub-pixel. Thus, at least one sub-pixel may have an area in which the first electrode 730 does not overlap with the bank 1115.

The light emitting layer 740 of the organic light emitting diode may be disposed on an area of the first electrode 730 that does not overlap with the bank 1115. The light emitting layer 740 may be disposed on the first electrode 730 and the bank. The second electrode 750 of the organic light emitting diode OLED may be disposed on the light emitting layer 740.

The light emitting layer 740 of the organic light emitting diode OLED may be formed by a method of deposition or coating having straightness. For example, the light emitting layer 740 may be formed by a method of a physical vapor deposition PVD, such as an evaporation process.

In the light emitting layer 740 formed by this method, a thickness of an area with a certain angle to the substrate 1101 may be smaller than a thickness of an area parallel to the substrate 1101. For example, a thickness of the light emitting layer 740 disposed in an area corresponding to the inclined portion 1114b of the concave portion 1114c may be smaller than a thickness of the light emitting layer 740 disposed on the first electrode 730 not covered by the bank 1115. Further, the thickness of the light emitting layer 740 disposed in the area corresponding to the inclined portion 1114b of the concave portion 1114c may be smaller than a thickness of the light emitting layer 740 disposed on the periphery portion 1114d of the insulating film 1114.

When the organic light emitting diode OLED is driven, the highest current density is formed in an area in which a thickness of the light emitting layer 740 is relatively thin, that is, in an area corresponding to the inclined portion 1114b of the concave portion 11114c, and electric fields may be strongly formed in the area corresponding to the inclined portion 1114b of the concave portion 1114c.

Accordingly, luminescence characteristics of the organic light emitting diode OLED in the area corresponding to the inclined portion 1114b of the concave portion 1114c may be different from luminescence characteristics of the organic light emitting diode OLED in an area corresponding to the flat portion 1114a, and thus, associated components may become deteriorated.

In accordance with embodiments of the present disclosure, since the bank 1115 is disposed to cover the inclined portion 1114b of the concave portion 1114c, it may therefore be possible to prevent the deterioration of associated components in the area corresponding to the inclined portion 1114*b* of the concave portion 1114*c* and to prevent the phenomenon that luminescence characteristics are different in each area.

However, a thickness of the light emitting layer 740 according to embodiments of the present disclosure is not limited to such a specific condition; thus, the thickness of the light emitting layer 740 may have a value corresponding to its location.

Meanwhile, the first electrode 730 may include a reflective metal. FIG. 11 shows the first electrode 730 with a single layer, but embodiments of the present disclosure are not limited thereto. For example, the first electrode 730 may be formed of multiple layers. When the first electrode 730 is formed of multiple layers, at least one of the multiple layers may have a reflective metal.

For example, the first electrode 730 may include at least one of aluminum (Al), neodium (Nd), nickel (Ni), titanium (Ti), tantalum (Ta), copper (Cu), silver (Ag), and aluminum alloy, but embodiments of the present disclosure are not limited thereto.

The second electrode 750 may include a conductive material transmitting or semi-transmitting light. For example, the second electrode 750 may include at least one kind of transparent conductive oxide, such as indium tin oxide (ITO), indium zinc oxide (IZO), indium tin zinc oxide (ITZO), zinc oxide, tin oxide, and the like, or include a semi-transmissive metal, such as magnesium (Mg), silver (Ag), or an alloy of Mg and Ag. Here, when the second electrode 750 includes a semi-transmissive metal, a thickness of the second electrode 750 may be smaller than that of the first electrode 730.

Further, as shown in FIG. 11, an auxiliary electrode 1111 (which may be referred to as an auxiliary line) contacting the second electrode 750 may be further disposed in an area corresponding to the non-light emitting area 1073 in the active area A/A.

Specifically, the auxiliary electrode 1111 may be disposed on the interlayer insulating film 1103. The protective film 1104, the insulating film 1114 and the bank 1115 may have a hole that does not cover the auxiliary electrode 1111. The second electrode 750 may contact the auxiliary electrode through the hole of the protective film 1104, the insulating film 1114 and the bank 1115 that do not cover the auxiliary electrode.

When an organic light emitting display panel has a large area, voltage drop due to the resistance of the second electrode 750 may cause a difference in luminance between a periphery portion and a center portion of the panel. However, in the organic light emitting display panel according to embodiments of the present disclosure, it is possible to prevent a voltage through the auxiliary electrode 1111 contacting the second electrode 750 from being dropped. Thus, when the organic light emitting display panel according to embodiments of the present disclosure is a panel with a large area, it is possible to prevent the occurrence of the luminance difference in the panel.

FIG. 11 shows that one auxiliary electrode 1111 is disposed in one subpixel SP, but embodiments of the present disclosure are not limit thereto. For example, one auxiliary electrode 1111 may be disposed one a plurality of subpixels SP basis.

Further, the location of the auxiliary electrode 1111 shown in FIG. 11 is merely one example; thus, embodiments of the present disclosure are not limit thereto.

For another example, when the organic light emitting display panel according to embodiments of the present disclosure is not a panel with a large area, the panel may not include the auxiliary electrode 1111.

Further, as shown in FIG. 11, a storage capacitor Cst may be disposed in the active area A/A. The storage capacitor Cst may include a first storage capacitor electrode 1112 disposed on an identical layer to the gate electrode 1107 and a second storage capacitor electrode 1113 disposed on an identical layer to the source electrode 1108 and the drain electrode (1109), but the structure of the storage capacitor Cst of the present disclosure is not limited thereto.

At least one layer of encapsulation layer 960 may be disposed on the second electrode 750 of the organic light emitting diode OLED.

For example, the encapsulation layer 960 may include a first encapsulation layer 1161 disposed on the second electrode 750, a second encapsulation layer 1162 disposed on the first encapsulation layer 1161 and a third encapsulation layer 1163 disposed on the second encapsulation layer 1162.

Thus, when the encapsulation layer 960 is formed of multiple layers, at least one of the multiple layers may include an inorganic insulating material, and at least another layer may include an organic insulating material.

According to embodiments of the present disclosure, the first encapsulation layer 1161 and the third encapsulation layer 1163 may include an inorganic insulating material, and the second encapsulation layer 1162 may include an organic insulating material; however, embodiments of the present disclosure are not limited thereto.

The encapsulation layer 960 disposed on the organic light emitting diode OLED may serve to prevent moisture or particles from penetrating the organic light emitting diode OLED.

Meanwhile, FIG. 11 illustrates that the encapsulation layer 960 is disposed in the active area A/A, but embodiments of the present disclosure are not limited thereto. For example, the encapsulation layer 960 may extend from the active area A/A and be disposed up to a part of the non-active area N/A.

A first touch buffer layer 1116*a* may be disposed on the third encapsulation layer 1163.

A plurality of patterned bridges 320 may be disposed on the first touch buffer layer 1116*a*, and a second touch buffer layer 1116*b* may be disposed on the patterned bridges 320.

Further, a plurality of touch electrodes 310 may be disposed on the second touch buffer layer 1116*b*. The plurality of touch electrodes 310 may contact the patterned bridges 320 through holes formed on the second touch buffer layer 1116*b*.

Meanwhile, the touch electrodes 310 may be transparent electrodes or opaque electrodes.

The top surface of the first electrode 730 not covered by the opening of the bank 1115 may be an area corresponding to the first area 1071 of the display device.

As illustrated in FIG. 10, the touch electrode 310 may be located in the non-light emitting area 1073 surrounding the light emitting area 1070. Since the touch electrode 310 is located in the non-light emitting area 1073, luminance degradation in the display device caused by the touch electrode 310 may be prevented.

The touch electrode 310 may not be located in an area corresponding to the flat portion 1114*a* in the subpixel SP, and may not be located in an area corresponding to the inclined portion 1114*b* in the subpixel SP. That is, the touch electrode 310 may not be located in an area corresponding to the concave portion 1114*c* in the subpixel SP.

That the touch electrode 310 is not located in the area corresponding to the flat portion 1114a in the subpixel SP may mean that the touch electrode 310 does not overlap with the flat portion 1114a in the subpixel SP.

That the touch electrode 310 is not located in the area corresponding to the inclined portion 1114b in the subpixel SP may mean that the touch electrode 310 does not overlap with the inclined portion 1114b in the subpixel SP.

That the touch electrode 310 is not located in the area corresponding to the concave portion 1114c in the subpixel SP may mean that the touch electrode 310 does not overlap with the concave portion 1114c in the subpixel SP.

As described above, since the touch electrode 310 is located not to overlap with the concave portion 1114c, it may be possible to prevent strength of light emitted from the light emitting layer 740 from being weakened due to being blocked by, or transmitting, the touch electrode 310. Thus, the display device may provide improved luminance.

A planarization layer (not shown) may be located on the touch electrode 310. The planarization layer may be a layer for planarizing irregularities resulting from the touch electrode 310, and for example, may be formed of an organic material.

The first area 1071 may correspond to the flat portion 1114a of the concave portion 1114c. That the first area 1071 corresponds to the flat portion 1114a may mean that the first area 1071 overlaps with the flat portion 1114a in the subpixel SP.

The first area 1071 of the light emitting area 1070 may be a main source of light directly exiting outwards from the display device without being reflected from the first electrode 730 located on the inclined portion 1114b after being emitted from the light emitting layer 740, rather than light being reflected from the first electrode 730 located on the inclined portion 1114b after being emitted from the light emitting layer 740 and then exiting outwards from the display device.

The second area 1072 may correspond to the inclined portion 1114b of the concave portion 1114c. That the second area 1072 corresponds to inclined portion 1114b may mean that the second area 1072 overlaps with the inclined portion 1114b in the subpixel SP.

The second area 1072 of the light emitting area 1070 may be a main source of light being reflected from the first electrode 730 located on the inclined portion 1114b after being emitted from the light emitting layer 740 and then exiting outwards from the display device, rather than light directly exiting outwards from the display device without being reflected from the first electrode 730 located on the inclined portion 1114b after being emitted from the light emitting layer 740.

A polarizing plate (not shown) may be located on the planarization layer. The polarizing plate may prevent the visibility of the display device from being degraded as light entering into the display device from the outside is reflected by the display panel of the display device. Furthermore, a cover glass may be located on the polarizing plate. The cover glass may be, for example, a glass substrate or a polymer plastic substrate.

Figure 12:
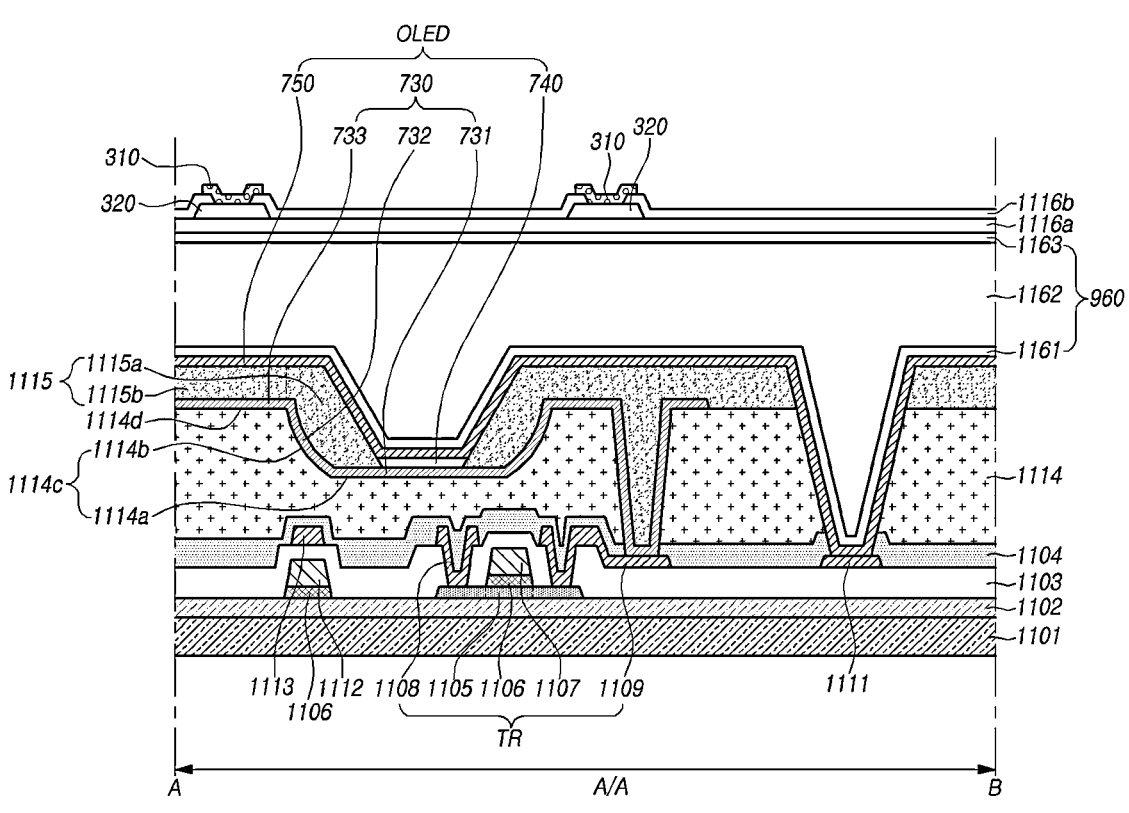

FIG. 12 illustrates an area taken along line A-B of the display device including the display panel according to embodiments of the present disclosure illustrated in FIG. 10 and a part of a non-active area. The discussions on the embodiment illustrated in FIG. 11 conducted above are equally applied to configurations included in the embodiment illustrated in FIG. 12 unless explicitly stated otherwise.

Referring to FIG. 12, the inclined portion 1114b may include a high-inclined portion. When an angle between a portion of the inclined portion 1114b contacting the flat portion 1114a and a direction parallel to the substrate is defined as a first inclined angle, the high-inclined portion may have a second inclined angle larger than the first inclined angle.

Figure 13:
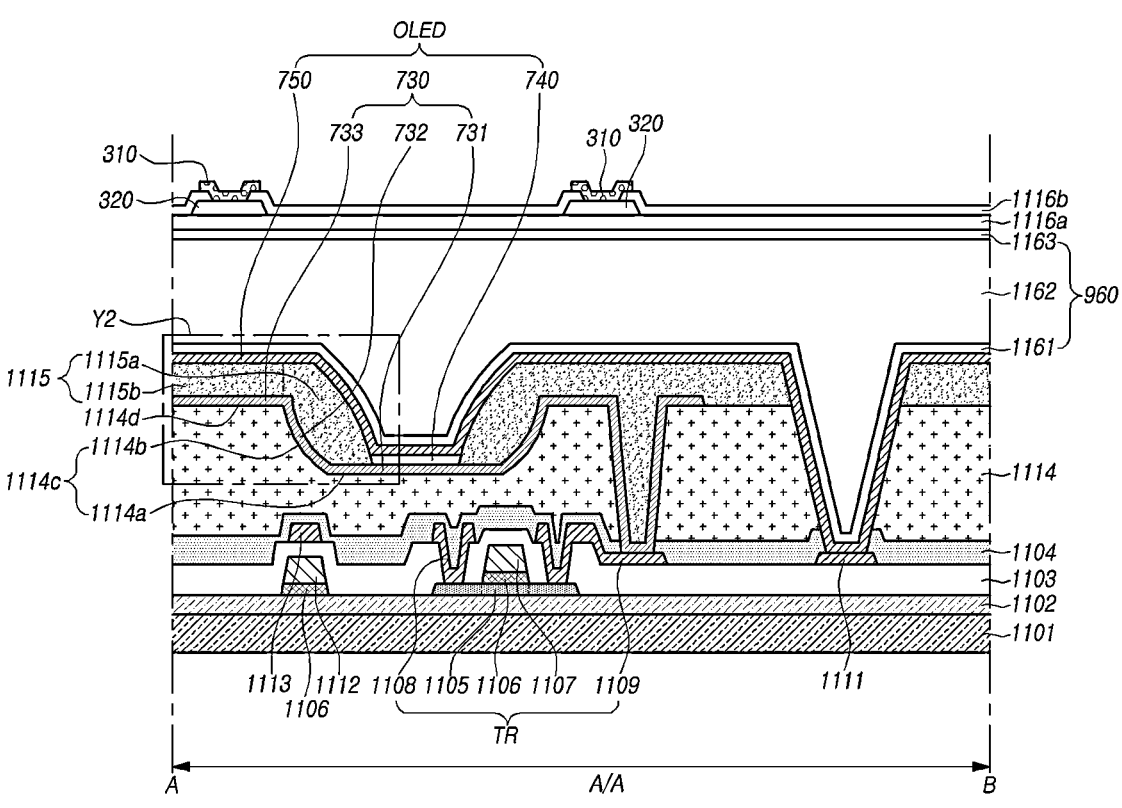

FIG. 13 illustrates an area taken along line A-B of the display device including the display panel according to embodiments of the present disclosure illustrated in FIG. 10 and a part of the non-active area. The discussions on the embodiment illustrated in FIG. 12 conducted above are equally applied to configurations included in the embodiment illustrated in FIG. 13 unless explicitly stated otherwise.

Referring to FIG. 13, the bank 1115 over the inclined portion 1114b may have a convex shape in the direction of the viewing surface.

Further, the bank 1115 over the inclined portion 1114b may have a shape in which an inclined angle between the bank 1115 over the inclined portion 1114b and a surface of the substrate 1101 decreases as the bank 1115 moves away from the flat portion 1114a in a direction parallel to the substrate 1101.

Further, a thickness of the bank 1115 over the inclined portion 1114b may increase and then decrease as the bank 1115 moves away from the flat portion 1114a in the direction parallel to the substrate 1101.

When the bank 1115 has the shape described above, the second electrode 750 located over the first part 1115a of the bank 1115 can be prevented from being disconnected. When the bank 1115 has a convex shape in the direction of the substrate 1101 and a concave shape in the direction of the viewing surface, which are shapes similar to the insulating film 1114, the second electrode 750 located over the first part 1115a of the bank 1115 may be disconnected in the process of depositing the second electrode 750. In accordance with embodiments of the present disclosure, the disconnection of the second electrode 750 over the first part 1115a can be prevented as the bank 1115 has the shapes described above.

Figure 14:
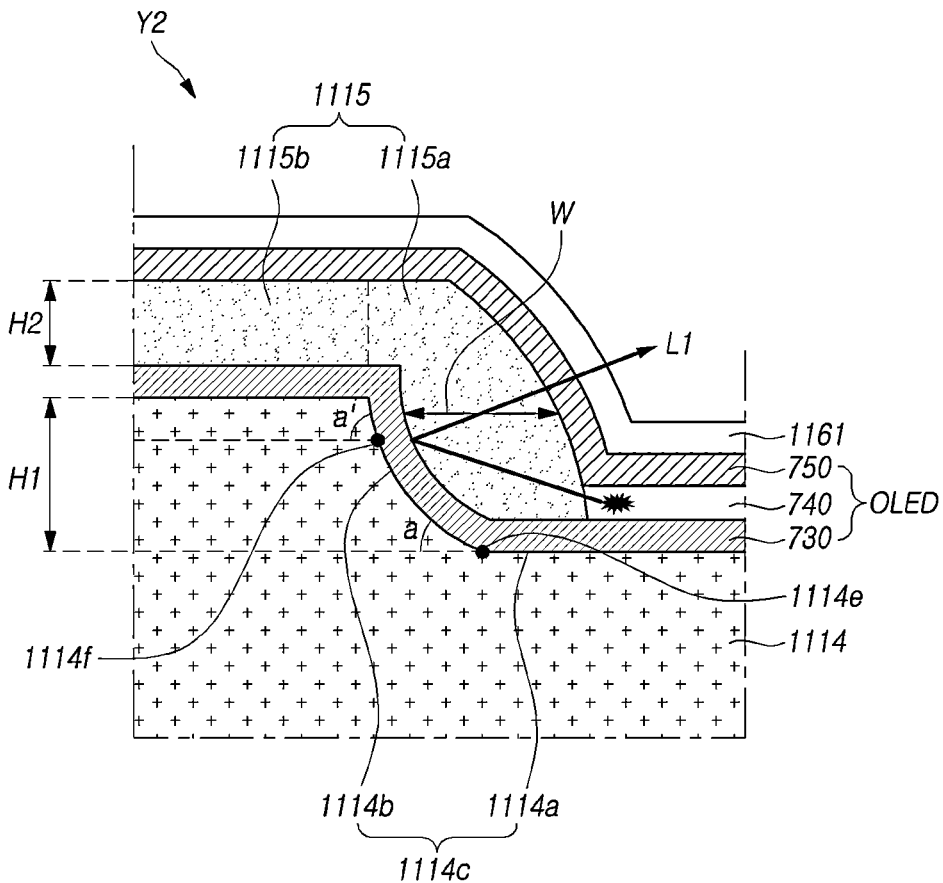
FIG. 14 is an expanded view of an area 'Y2' in FIG. 11.

FIG. 14 is an expanded view of an area 'Y2' in FIG. 13.

With reference to FIG. 14, the inclined portion 1114b may include a high-inclined portion 1114f. The high-inclined portion 1114f has a second inclined angle (a') larger than a first inclined angle (a) between a portion 1114e of the inclined portion 1114b contacting the flat portion 1114a and a surface of the substrate.

For convenience of description, in FIG. 14, the high-inclined portion 1114f with a certain angle is illustrated; however, embodiments of the present disclosure are not limited to the location or angle of the high-inclined portion 1114f shown in FIG. 14. As described above, since the high-inclined portion 1114f is a part of the inclined portion 1114b, that is, it indicates the part of the inclined portion 1114b with an inclined angle larger than the inclined angle (a) of the portion 1114e of the inclined portion 1114b contacting the flat portion 1114a to the surface of the substrate, one or more high-inclined portions 1114f may be located in the inclined portion 1114b.

Since the inclined portion 1114b has such a high-inclined portion 1114f, light exiting outwards from the display panel 110 may increase, and luminance of the display panel 110 may be improved. When light L1 emitted from the light emitting layer 740 travels toward the inclined portion 1114b, in case the inclined portion 1114b includes such a high-inclined portion 1114f, the first electrode 730 may effectively reflect the light L1. As a result, the luminance of the display panel 110, in particular, luminance in the front of the display panel 110 ("referred to as "front luminance"), may be improved.

An inclined angle between all or at least a part of the inclined portion 1114*b* and a surface of the substrate 1101 may increase as the inclined portion 1114*b* moves away from the flat portion 1114*a* in a direction parallel to the substrate 1101. That is, all or at least a part of the inclined portion 1114*b* may have a convex shape in a direction of the substrate 1101 and a concave shape in a direction of the viewing surface. That the inclined angle of the at least a part of the inclined portion 1114*b* increases may mean that an inclined angle in a partial area of the inclined portion 1114*b* located between the flat portion 1114*a* and the periphery portion 1114*d* increases. That the inclined angle of the all of the inclined portion 1114*b* increases may mean that an inclined angle of the inclined portion 1114*b* located between the flat portion 1114*a* and the periphery portion 1114*d* increases across the substantial entire area of the inclined portion 1114*b*. When the inclined portion 1114*b* has the shape described above, the first electrode 730 may reflect light emitted from the light emitting layer 740 more effectively; the light may in turn exit outwards from the display panel 110; and thus, the luminance of the display panel 110, in particular, front luminance, may be improved.

The second inclined angle (a') of the high-inclined portion 1114*f* may be more than twice the first inclined angle (a). For example, the first inclined angle (a) may be in a range of 20° to 40°, and the second inclined angle (a') may be in a range of 50° to 80° and more than twice the first inclined angle (a).

Here, it may be possible to enable the inclined portion 1114*b* to be located at a higher location relative to the light emitting layer 740 by increasing a size of the first inclined angle (a). In this case, although it may not be easy to increase the size of the first inclined angle due to the reflowing of compositions for forming the insulating film 1114, it may be relatively easy for the first inclined angle (a) to have a value corresponding to a relatively lower location and for the inclined portion 1114*b* to have a more high-inclined portion 1114*f*. Accordingly, a structure of the insulating film 1114 that is capable of effectively reflecting light L1 emitted toward the inclined portion 1114*b* from the light emitting layer 740 may be easily formed when the values of the second inclined angle (a') and the first inclined angle (a) satisfy the above conditions.

A height (H1, e.g., a depth of the concave portion) of the inclined portion 1114*b* of the insulating film 1114 may be 0.7 μm or more. Here, the height H1 of the inclined portion 1114*b* may refer to a shortest distance from a line extending from the flat portion 1114*a* of the concave portion 1114*c* in parallel to a surface of the substrate 1101 up to the periphery portion 1114*d*.

Meanwhile, according to embodiments of the present disclosure, the height H1 of the insulating film 1114 in which the inclined portion 1114*b* of the concave portion 1114*c* is located are not limited to such a specific value. For example, the height H1 may be sufficient if the concave portion 1114*c* of the insulating film 1114 is formed to have a height that does not expose the structures or elements disposed under the insulating film 1114.

The height H1 of the inclined portion 1114*b* may be larger than that of the bank 1115 disposed over the periphery portion 1114*d* of the concave portion 1114*c*. Further, the height H1 of the inclined portion 1114*b* may be larger than that of the second part 1115*b* of the bank 1115.

Thus, the larger the height H1 of the inclined portion 1114*b* is, the greater an amount of light reflected from the second area 732 of the first electrode 730. Therefore, light extraction efficiency may be improved.

An angle (a) between the inclined portion 1114*b* of the concave portion 1114*c* and the horizontal surface may be greater than or equal to 27° and less than 80°.

A distance W between the bank 1115 and a surface of the first electrode 730 in an area corresponding to the incline 1114*b* of the concave 1114*c* may be 3.2 μm or less, 2.6 μm or less, or 2.0 μm or less. Further, a distance W between the bank 1115 and the surface of the first electrode in the second area 732 of the first electrode 730 may be 3.2 μm or less, 2.6 μm or less, or 2.0 μm or less.

The size of the first area 1071 may be increased as the distance W is smaller, and light extraction efficiency may be enhanced by reducing paths of light that exits to the outside after being reflected from the second area 732 of the first electrode 730. Thus, a lower limit of a value of the distance W according to embodiments of the present disclosure are not limited to such specific values; for example, it may be 0.1 μm or more, 0.3 μm or more, or 0.5 μm or more.

By adjusting the range of the distance W as described above, it may be possible to provide a display panel capable of increasing the size of first area 1071 and enhancing light extraction efficiency.

Figure 15:
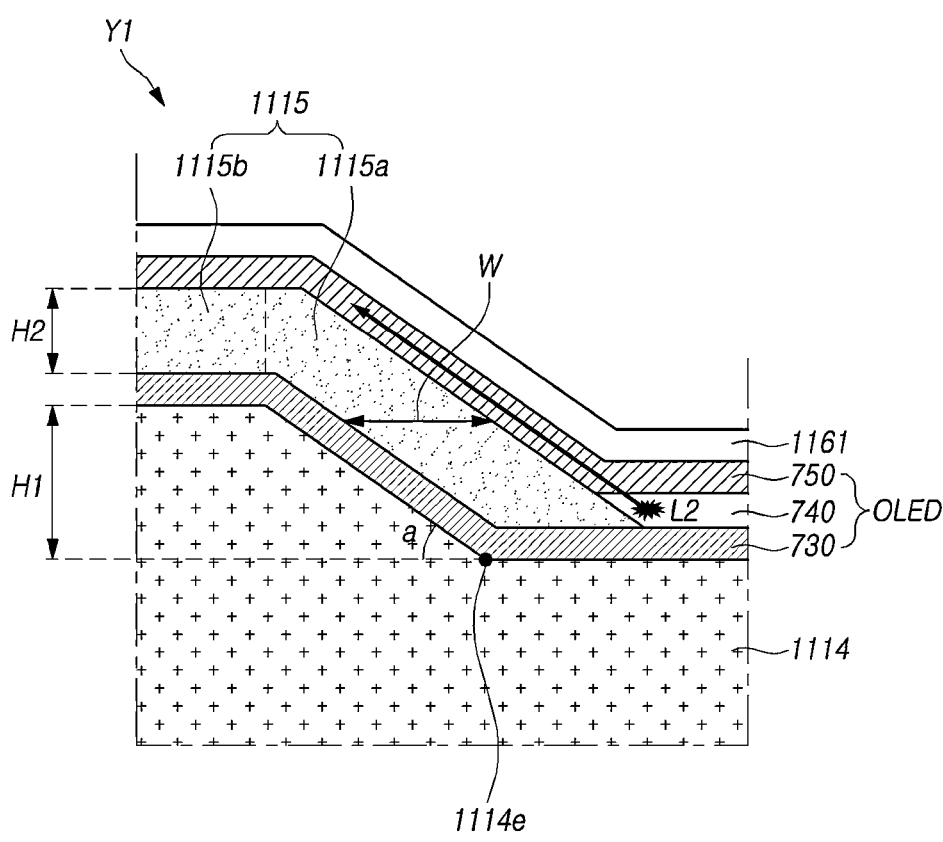
FIG. 15 is an expanded view of an area of a display panel in an embodiment of the present disclosure corresponding to the area 'Y1' of the display device in the display panel according to embodiments of the present disclosure.

FIG. 15 is an expanded view of an area "Y1" in FIG. 11.

Referring to FIG. 15, since the first electrode 730 is also disposed in the inclined portion of the insulating film, some of light emitted from the light emitting layer may be reflected from the first electrode 730 located in the inclined portion and then extracted outwards.

It can be seen that light L2 emitted toward the inclined portion of the insulating film from the light emitting layer 740 is not reflected from the first electrode 730 because the inclined portion does not include the high-inclined portion. Accordingly, when the high-inclined portion is not included, the extraction of the light L2 cannot be effective; therefore, the display panel of the comparative example may have poor front luminance as compared with the display panel according to the embodiment illustrated in FIG. 14.

Figure 16:
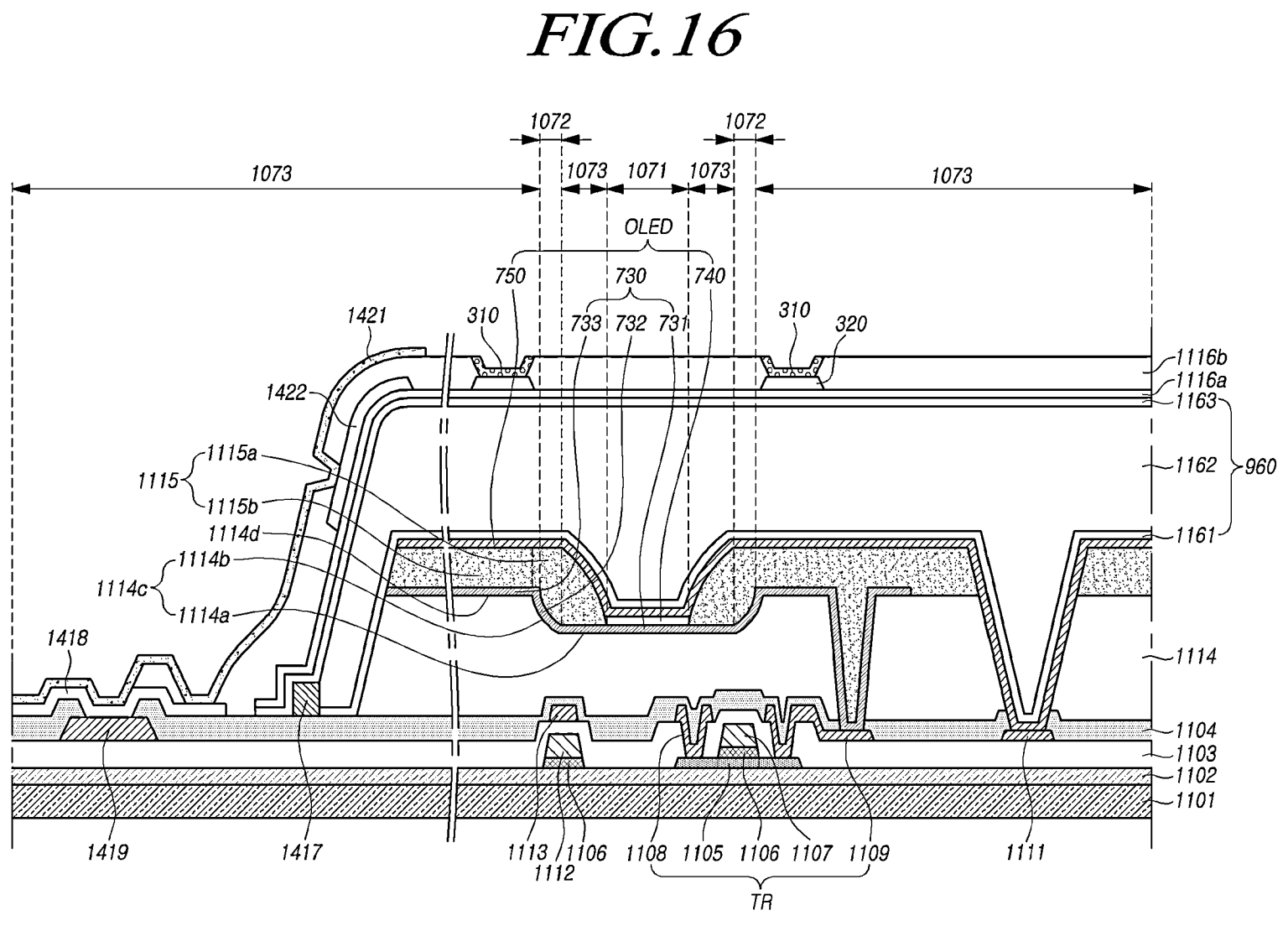

FIG. 16 illustrates the active area and the non-active area extending from the active area according to embodiments of the present disclosure. In the following description, some configurations, effects, etc. of the embodiments or examples discussed above may not be repeatedly described for convenience of description.

With reference to FIG. 16, one or more sub-pixels included in a display panel according to embodiments of the present disclosure may include one or more light emitting areas 1070. The light emitting area 1070 may include a first area 1071 and a second area 1072. The first area 1071 may be an area in which light exits outwards through a second electrode 750 locating over a flat portion 1114*a*. The second area 1072 may be an area in which light reflected from a first electrode 730 located on an inclined portion 1114*b* exits outwards.

The first area 1071 may be an area in which light mainly directly exiting outwards after passing through the second electrode 750 without being reflected from the first electrode 730 is present, and the second area 1072 may be an area in which light reflected from the first electrode 730 is present. Accordingly, since light exiting outwards from the first area 1071 and the light exiting outwards from the second area 1072 have different light paths, one or more of associated color coordinates and luminance may be different from each other.

Further, a plurality of touch electrodes 310 and a touch line 1421 may be disposed on a second touch buffer layer 1116*b*. The touch electrodes 310 may be located on the touch buffer layer 1116*a* and 1116*b* and be located not to overlap with a concave portion 1114*c*. Since the touch electrode 310 is located not to overlap with the concave portion 1114*c*, it is possible to prevent strength of light emitted from a light emitting layer 740 from being weakened due to being blocked by, or transmitting, the touch electrode 310; thus, the display device can provide improved luminance.

Touch electrodes 310 arranged in an identical row (or an identical column) may form one driving touch electrode line or one sensing touch electrode line, by being electrically connected to one another through one or more patterned bridge(s) 320.

FIG. 16 illustrates a configuration in which the touch electrode 310 and the touch line 1421 are located in an identical layer; however, embodiments of the present disclosure are not limited thereto. For example, the touch electrode 310 and the touch line 1421 may be located in different layers from each other.

Meanwhile, the touch line 1421 may be electrically connected to an auxiliary line 1422 disposed on a layer identical to the patterned bridge 320. For example, as illustrated in FIG. 16, the touch line 1421 may contact the auxiliary line 1422 disposed beneath the second touch buffer layer 1116*b* through a contact hole formed in the second touch buffer layer 1116*b*. Since the touch line 1421 is electrically connected to the auxiliary line 1422, resistance of the touch line 1421 may be reduced.

Here, the touch line 1421 and the touch electrode 310 may be electrically connected. The touch line 1421 is located over a dam 1417 and extends up to a pad portion PAD with one or more conductive pads which is located in a periphery of the dam 1417. Here, the touch line 1421 is electrically connected to the pad portion PAD.

For example, the touch line 1421 may be electrically connected to a pad 1419 of the pad portion PAD located in the non-active area N/A. FIG. 14 illustrates that the touch line 1421 is electrically connected to the pad 1419 through a pad connection line 1418; however, embodiments of the present disclosure are not limited thereto. For example, the pad 1419 and the touch line 1421 may be directly connected.

The pad 1419 connected to the touch line 1421 may be connected to a touch sensing circuit TSC. The touch sensing circuit TSC may supply a touch driving signal to at least one of a plurality of touch electrodes 310, and may detect at least one of the presence or absence of a touch and a touch location in response to the touch driving signal.

The touch line 1421, a third encapsulation layer 1163, and first and second touch buffer layers 1116*a* and 1116*b* may be disposed over the dam 1417. It should be noted that such a structure is merely an example of possible configurations; for example, the touch line 1421 may overlap with at least one of the third encapsulation layer 1163 and first and the second touch buffer layers 1116*a* and 1116*b*, over the dam 1417.

FIG. 16 illustrates that the single dam 1417 is included; however, embodiments of the present disclosure are not limited thereto. For example, the number of dams 1417 herein may be changed according to a size of the display device. In other words, the dam 1417 may include two or more dams, and when a plurality of dams 1417 is disposed over the substrate 1101, heights of at least two dams may be different from each other.

Meanwhile, FIGS. 11 to 14 and 16 illustrate that the touch electrode 310 is connected using the patterned bridge 320; however, embodiments of the present disclosure are not limited thereto.

Figure 17:
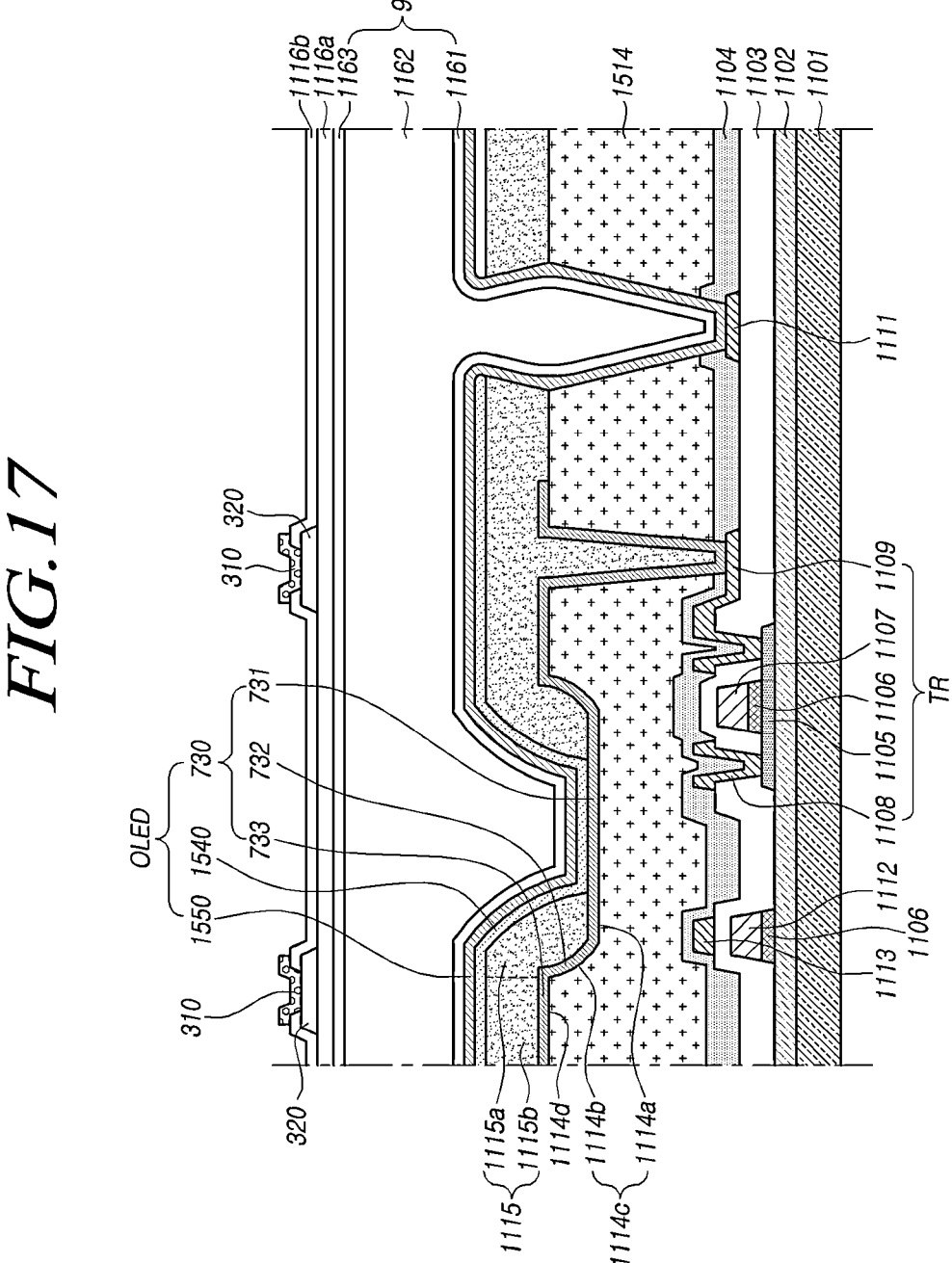
FIG. 17 is a cross-sectional view illustrating the display device according to embodiments of the present disclosure.

FIG. 17 is a cross-sectional view illustrating a display device according to embodiments of the present disclosure.

In the following description, some configurations, effects etc. of the embodiments or examples discussed above may not be repeatedly described for convenience of description.

With reference to FIG. 17, a light emitting layer 1540 of an organic light emitting diode OLED may be disposed to overlap with a bank 1115 and a first electrode 730 in the active area A/A, and be disposed not to cover the top surface of an auxiliary electrode 1111.

In this structure, in order for a second electrode 1550 to contact the auxiliary electrode 1111, the bank 1115 may have a structure that prevents the material of the light emitting layer 1540 from being deposited on the auxiliary electrode 1111 in a process of forming the light emitting layer 1540.

For example, as shown in FIG. 17, in an area surrounding a hole to expose the auxiliary electrode 1111, the bank 1115 may have a shape in which a width of the bank gradually increases as the bank 1115 is moved away from the substrate 1111. That is, as the bank 1115 is moved away from the substrate 1111, the hole entrance of the bank 1115 not covering the auxiliary electrode 1111 may become narrower.

Meanwhile, a process of forming the light emitting layer 1540 may be performed by a vapor deposition or coating method in which a raw material has straightness. For example, an evaporation method may be used. Further, a process of forming a second electrode 1550 may be performed by a vapor deposition or coating method in which directionality of a raw material is not constant. For example, a sputtering method may be used.

The hole entrance of the bank not covering the auxiliary electrode 1111 is narrow; therefore, the light emitting layer 1540 may not be disposed on the auxiliary electrode 1111 due to characteristics of the process of forming the light emitting layer 1540. Further, due to characteristics of the process of forming the second electrode 1550, even when the hole entrance of the bank 1115 is narrow, a raw material of the second electrode 1550 may enter into the hole, and therefore, the second electrode 1550 may be disposed on the auxiliary electrode 1111.

Display devices may be provided in accordance with other embodiments of the present disclosure.

The display devices in accordance with other embodiments of the present disclosure may include a plurality of sub-pixels, and may include a display panel and a driving circuit driving the display panel.

The display panels included in such display devices may be substantially equal to the display panels 110 in accordance with the embodiments of the present disclosure described above; therefore, discussions of these display panels 110 will not be given repeatedly.

These display devices include the display panels in accordance with the embodiments of the present disclosure described above; thus, they may provide excellent luminance.

The driving circuit may be substantially equal to the driving circuit in accordance with the embodiments of the present disclosure described above; therefore, discussions on this will not be given repeatedly.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A flexible display panel including a plurality of sub-pixels, comprising:

a transistor on a substrate;

a plurality of sub-pixels electrically connected to the transistor, each one of the plurality of sub-pixels including an organic light emitting diode;

an encapsulation layer on the organic light emitting diode;

a plurality of mesh-patterned touch electrodes on the encapsulation layer, the plurality of touch electrodes each including a respective mesh hole, wherein, in a plan view, at least two of the mesh holes respectively include at least two light emitting areas, wherein a first mesh hole corresponds to a first sub-pixel, and a second mesh corresponds to a second sub-pixel, wherein the at least two light emitting areas of the first sub-pixel includes a first light emitting area and a second light emitting area around the first light emitting area with a non-emission area between the first and second light emitting areas, the second light emitting area of the first-subpixel completely surrounding the first light emitting area, and wherein the at least two light emitting areas of the second sub-pixel includes a first light emitting area, and a second light emitting area around the first light emitting area with a non-emission area between the first and second light emitting areas, the second light emitting area of the second sub-pixel surrounding the first light emitting area.

2. The flexible display panel according to claim 1, wherein a size of the at least two light emitting areas of the first mesh hole corresponding to the first sub-pixel is different from a size of the at least two light emitting areas of the second mesh hole corresponding to the second sub-pixel.

3. The flexible display panel according to claim 2, wherein a size of the first light emitting area of the first mesh hole is different than a size of the first light emitting area of the second mesh hole.

4. The flexible display panel according to claim 2, wherein a size of the second light emitting area of the first mesh hole is different than a size of the second light emitting area of the second mesh hole.

5. The flexible display panel according to claim 2, wherein the second light emitting area of the first mesh hole is continuous, and wherein the second light emitting area of the second mesh hole is discontinuous.

6. The flexible display panel according to claim 1, wherein the plurality of mesh-patterned touch electrodes include a bridge configuration including one or more patterned bridges connecting the plurality of touch electrodes.

7. The flexible display panel according to claim 1, further comprising an insulation film between the transistor and the organic light emitting diode, wherein the insulation film includes at least one concave portion in one or more of a plurality of sub-pixels.

8. The flexible display panel according to claim 7, wherein the organic light emitting diode includes a first electrode, a light emitting layer, and a second electrode, and wherein the first electrode is on the at least one concave portion of the insulation film.

9. The flexible display panel according to claim 8, wherein the at least one concave portion includes an inclined portion and a flat portion extending from the inclined portion, and wherein the first electrode is disposed on the inclined portion of the at least one concave portion.

10. The flexible display panel according to claim 9, further comprising a bank disposed on a portion of the first electrode, the bank covering the first electrode disposed on the inclined portion.

11. The flexible display panel according to claim 10, wherein the light emitting layer, and the second electrode are disposed on the first electrode and the bank.

12. The flexible display panel according to claim 9, wherein the inclined portion of the at least one concave portion has a first height, and the bank has a second height, and wherein the first height is greater than the second height.

13. The flexible display panel according to claim 1, further comprising a color filter layer between the encapsulation layer and the plurality of touch electrodes, or on the plurality of touch electrodes.

14. The flexible display panel according to claim 1, further comprising a touch buffer layer between the encapsulation layer and the plurality of touch electrodes.

15. The flexible display panel according to claim 14, further comprising a touch line electrically connected to the plurality of touch electrodes, wherein the touch line is electrically connected with a pad in a pad portion.

16. A flexible display panel including a plurality of sub-pixels, comprising:

a substrate;

a transistor on the substrate;

a plurality of sub-pixels electrically connected to the transistor, each one of the plurality of sub-pixels including an organic light emitting diode;

an encapsulation layer on the organic light emitting diode;

a plurality of mesh-patterned touch electrodes on the encapsulation layer, the plurality of touch electrodes each including a respective mesh hole among a plurality of mesh holes, wherein a first mesh hole of the plurality of mesh holes corresponds to a first subpixel and includes at least two light emitting areas, wherein a second mesh hole of the plurality of mesh holes corresponds to a second subpixel includes at least two light emitting areas, wherein the at least two light emitting areas of the first sub-pixel includes a first light emitting area and a second light emitting area completely surrounding the first light emitting area with a non-emission area between the first and second light emitting areas, and wherein the at least two light emitting areas of the second sub-pixel includes a third light emitting area, and a fourth light emitting area surrounding the third light emitting area with a non-emission area between the third and fourth light emitting areas.

17. The flexible display panel according to claim 16, wherein a size of the at least two light emitting areas of the first mesh hole is different from a size of the at least two light emitting areas of the second mesh hole.

18. The flexible display panel according to claim 17, wherein a size of the first light emitting area is different than a size of the third light emitting area.

19. The flexible display panel according to claim 17, wherein a size of the second light emitting area is different than a size of the fourth light emitting area.

20. The flexible display panel according to claim 17, wherein the second light emitting area is continuous, and wherein the fourth light emitting area includes two discontinuous areas.

* * * * *